(12) United States Patent
Hayashi et al.

(10) Patent No.: US 9,257,454 B2
(45) Date of Patent: Feb. 9, 2016

(54) THIN FILM TRANSISTOR ARRAY SUBSTRATE

(71) Applicant: Mitsubishi Electric Corporation, Tokyo (JP)

(72) Inventors: Masami Hayashi, Kumamoto (JP); Takafumi Hashiguchi, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/340,890

(22) Filed: Jul. 25, 2014

(65) Prior Publication Data

US 2015/0034955 A1 Feb. 5, 2015

(30) Foreign Application Priority Data

Jul. 31, 2013 (JP) ................ 2013-158906

(51) Int. Cl.
| | |
|---|---|
| *H01L 27/12* | (2006.01) |
| *H01L 29/786* | (2006.01) |
| *G02F 1/1345* | (2006.01) |
| *H01L 29/66* | (2006.01) |

(52) U.S. Cl.
CPC ............ *H01L 27/1248* (2013.01); *H01L 27/12* (2013.01); *H01L 27/124* (2013.01); *G02F 1/13454* (2013.01); *H01L 29/66757* (2013.01); *H01L 29/78621* (2013.01)

(58) Field of Classification Search
USPC .................. 257/57, 59, 72, 83, 84, 210, 594, 257/E21.002, E23.011, E27.121, E29.273, 257/E29.291, E31.001, E33.001, E33.004, 257/E33.053; 349/58, 65, 110, 114, 349/140–141; 438/149
See application file for complete search history.

(56) References Cited

U.S. PATENT DOCUMENTS

| | | | |
|---|---|---|---|
| 6,836,301 B1* | 12/2004 | Kohtaka et al. | 349/43 |
| 7,636,144 B2 | 12/2009 | Horiguchi et al. | |
| 9,052,554 B2* | 6/2015 | Ota | G02F 1/134363 |
| 2015/0116623 A1* | 4/2015 | Tomioka | G02F 1/136227 |
| | | | 349/43 |

FOREIGN PATENT DOCUMENTS

| | | |
|---|---|---|
| JP | 2008-180928 A | 8/2008 |
| JP | 2009-128397 A | 6/2009 |

* cited by examiner

*Primary Examiner* — Michelle Mandala
*Assistant Examiner* — Tyler Drye
(74) *Attorney, Agent, or Firm* — Studebaker & Brackett PC

(57) ABSTRACT

A pixel electrode is connected to a drain electrode of TFT via a first aperture formed on a second interlayer insulating film, a second aperture, which includes a bottom portion of the first aperture and is formed on a common electrode, and a third aperture, which is included in the bottom portion of the first aperture and is formed on a first interlayer insulating film and a third interlayer insulating film. The common electrode is connected to a common wiring via a fourth aperture formed on the second interlayer insulating film, and a fifth aperture that is included in a bottom portion of the fourth aperture and is formed on the first interlayer insulating film, and a contact electrode that is formed in the fourth aperture and the fifth aperture.

28 Claims, 40 Drawing Sheets

F I G . 3
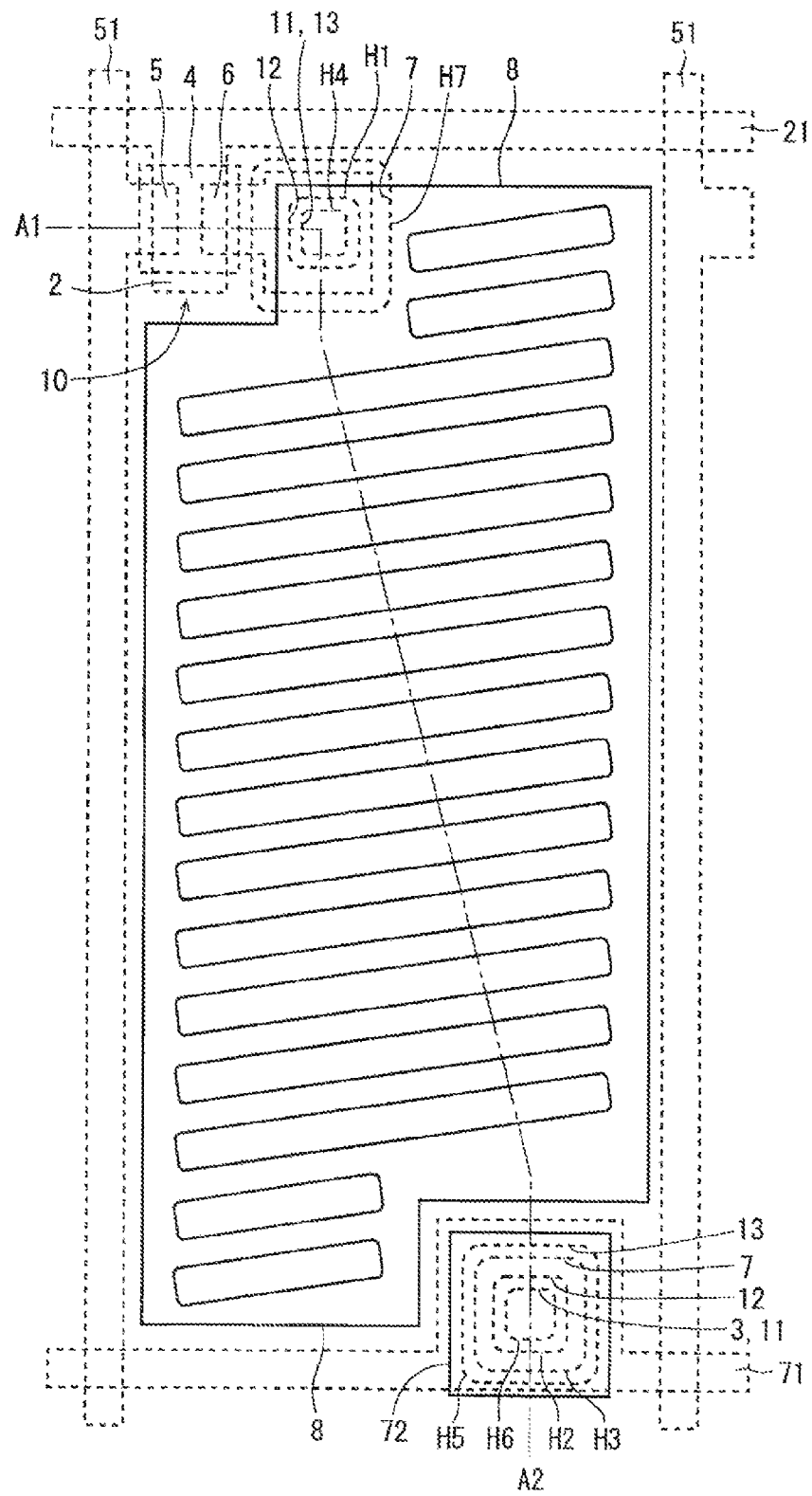

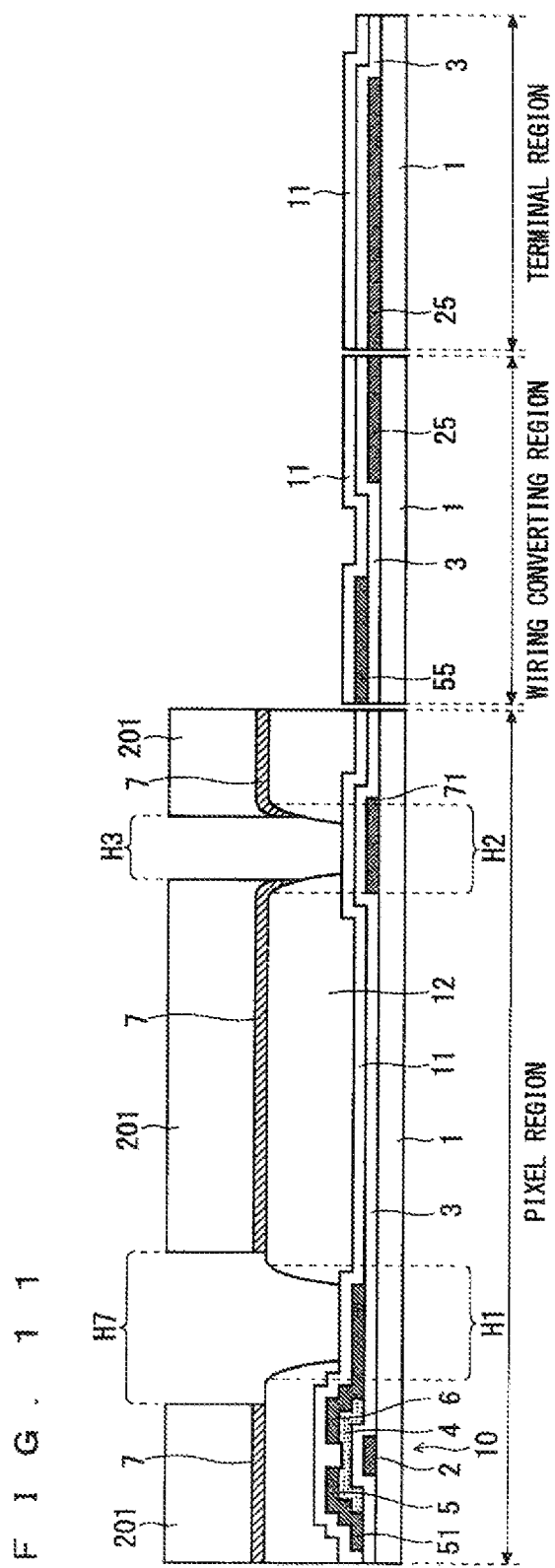

F I G . 1 2
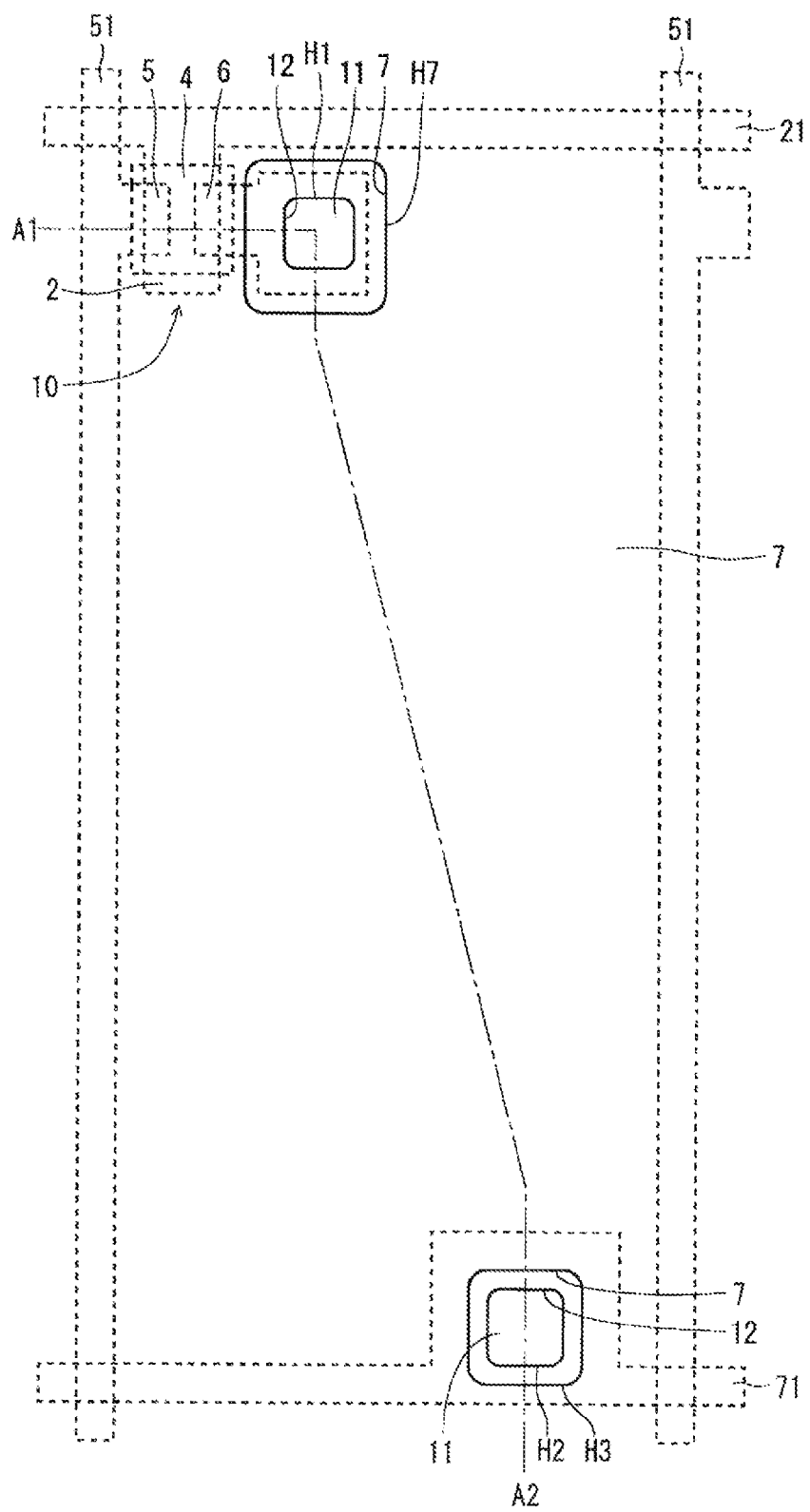

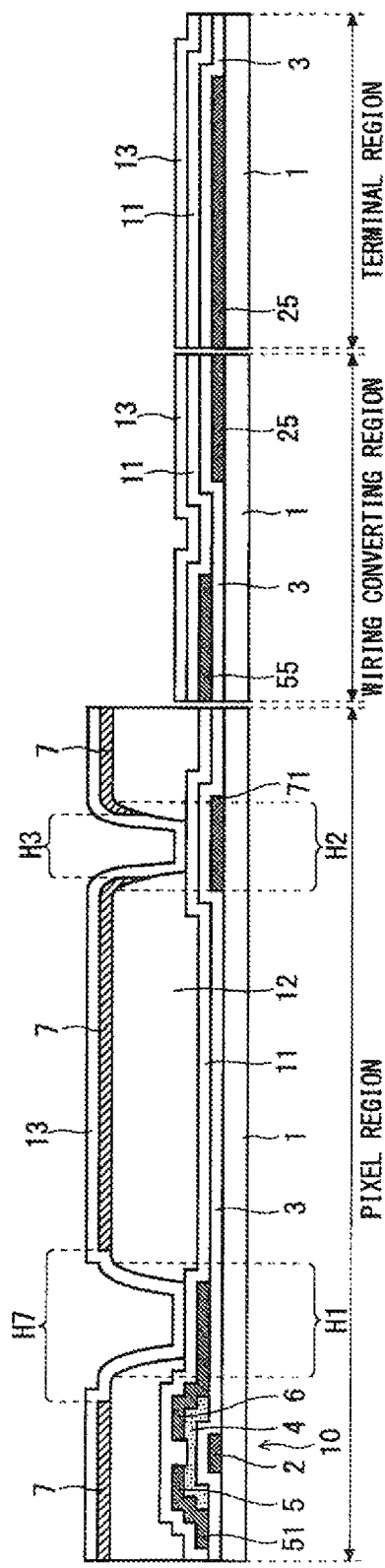

F I G. 1 5
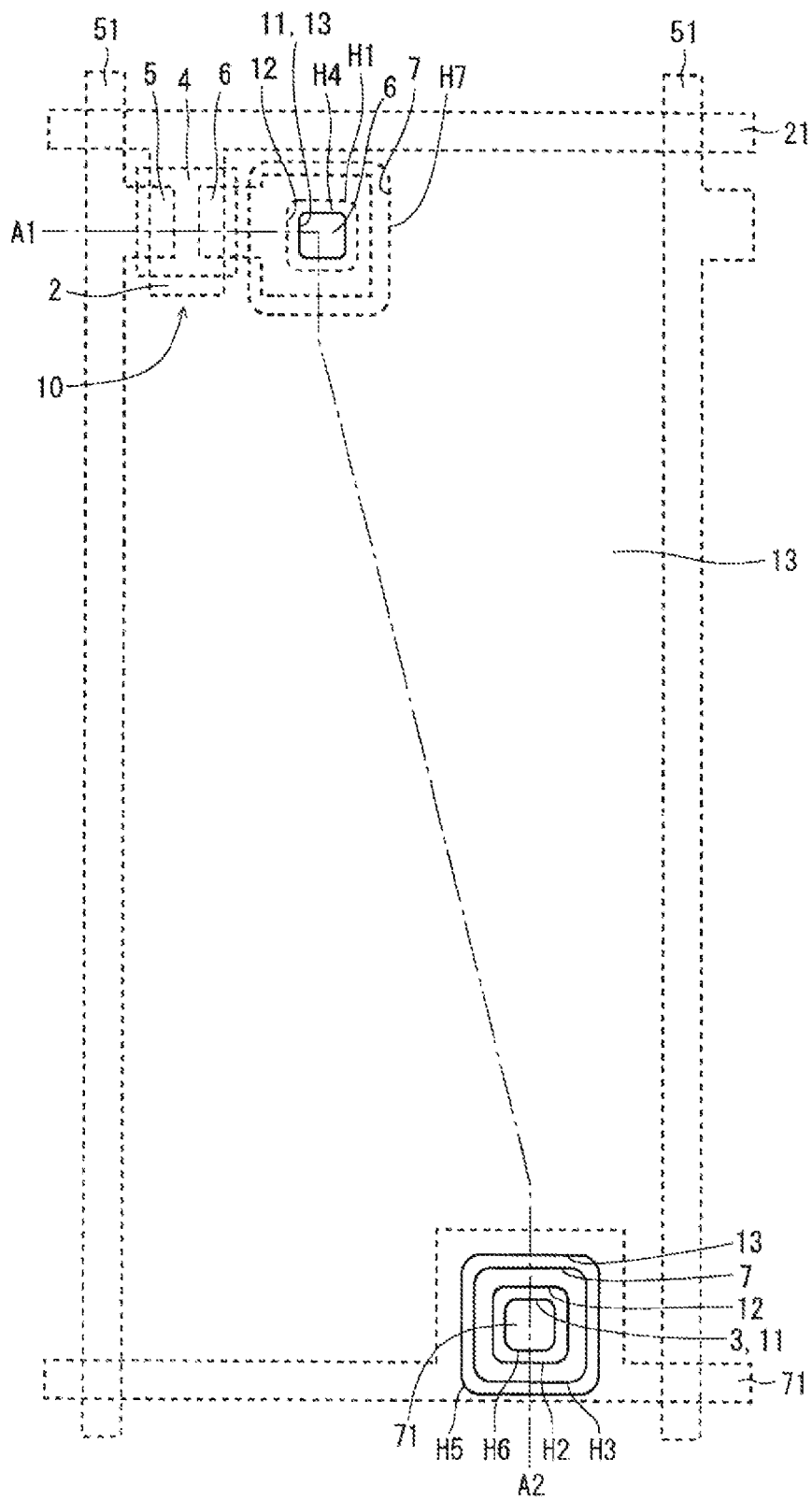

F I G . 1 9
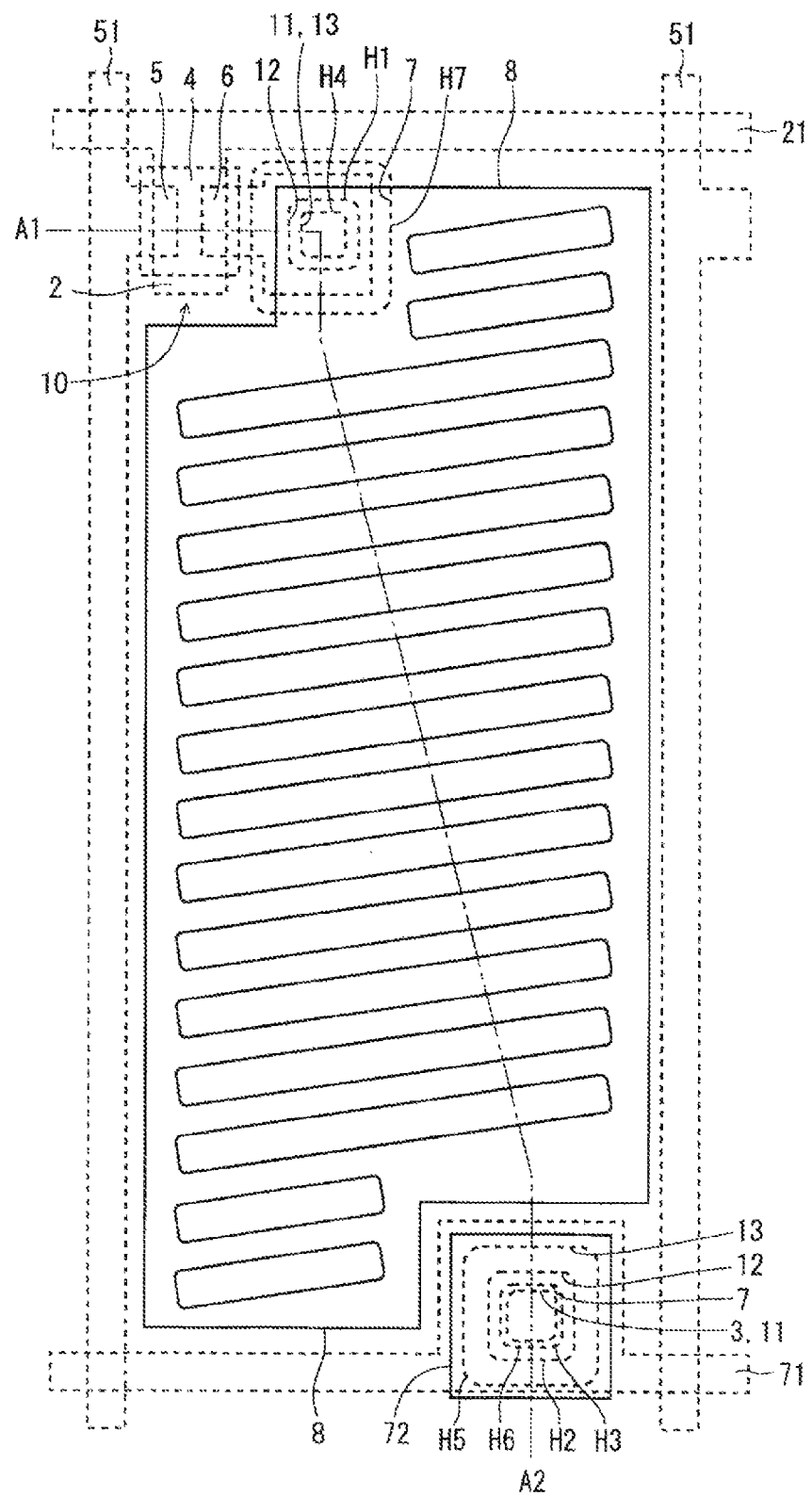

F I G . 2 6
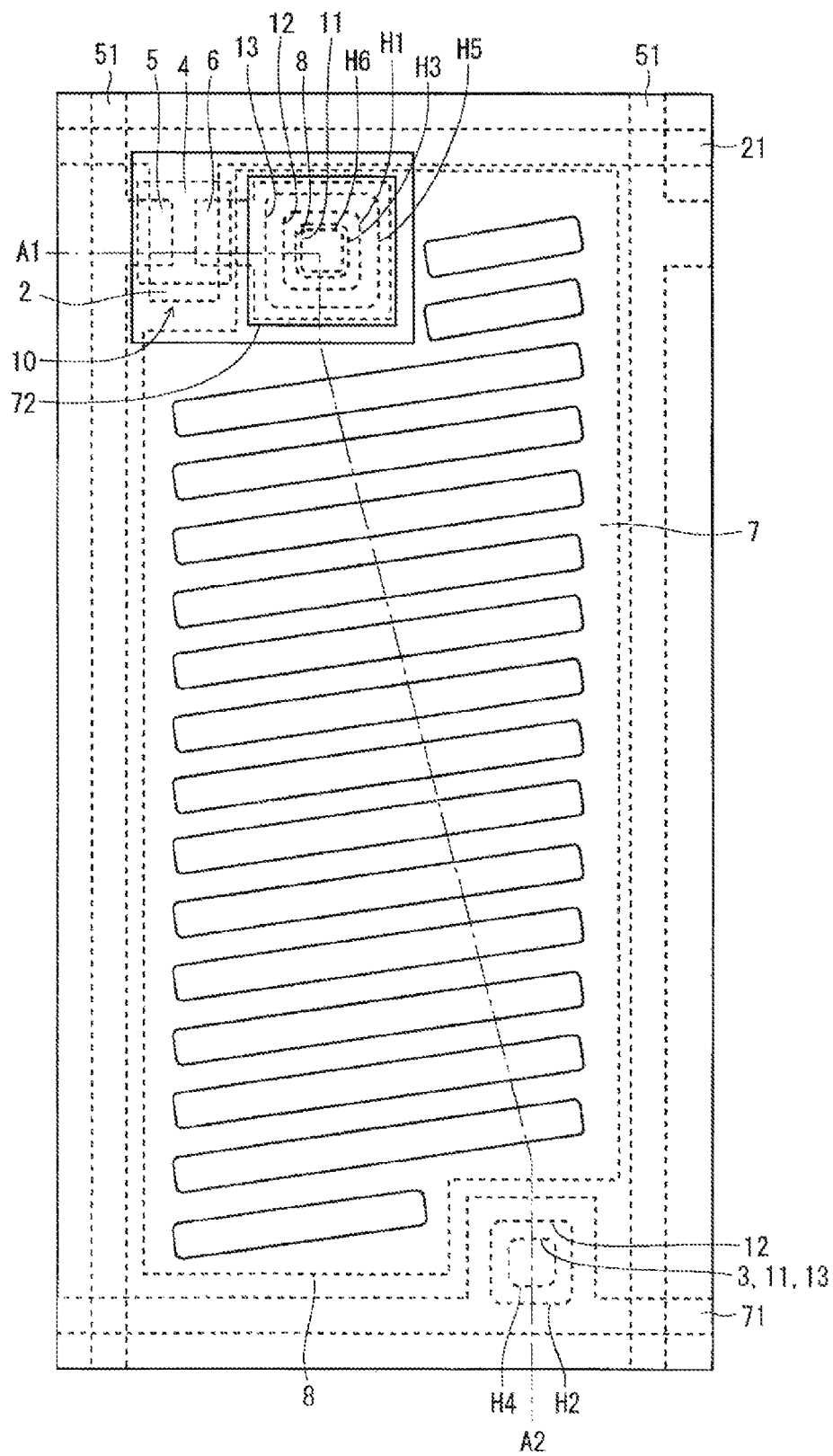

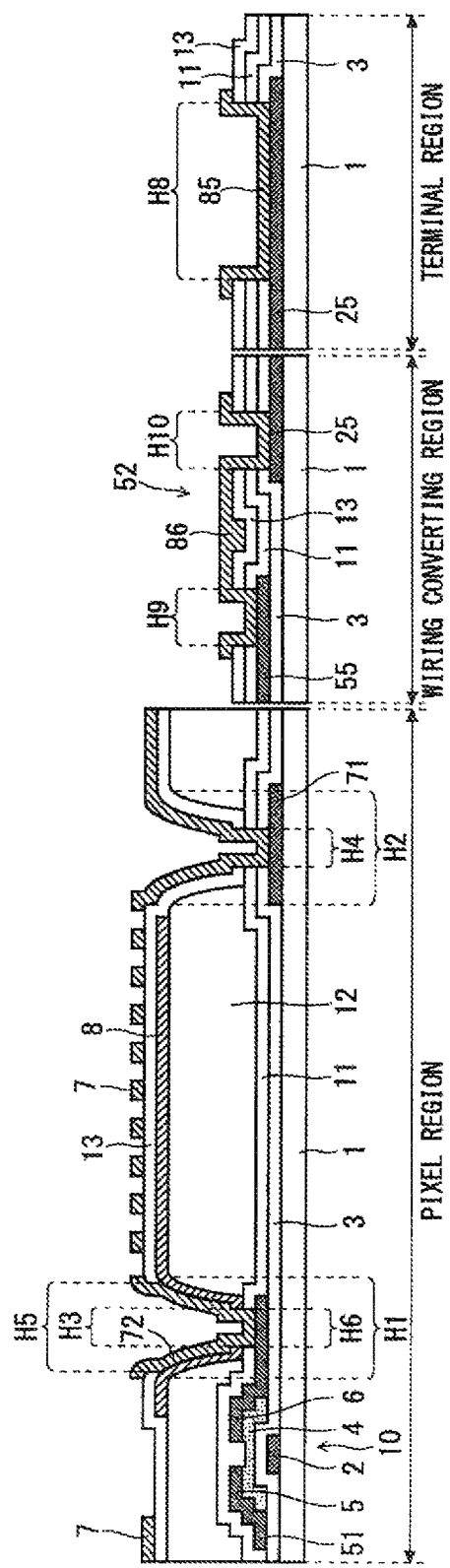

F I G . 3 7
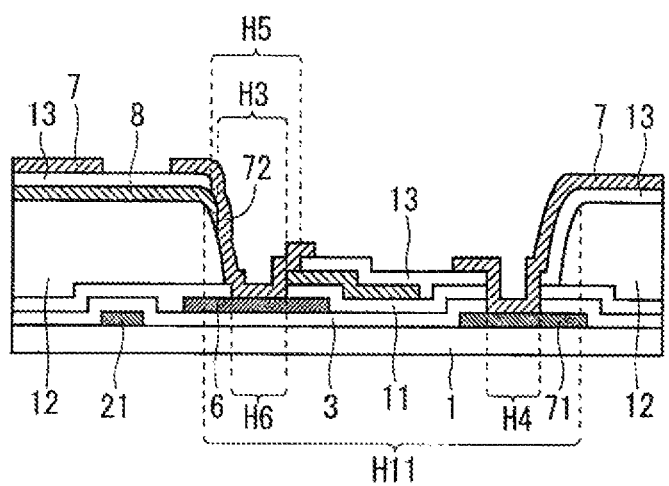

THIN FILM TRANSISTOR ARRAY SUBSTRATE

BACKGROUND OF THE INVENTION

1. Field of the Invention

The present invention relates to a thin film transistor array substrate to be used in a liquid crystal display device and the like.

2. Description of the Background Art

Conventionally, major examples of liquid crystal display devices have a structure having a TFT array substrate (hereinafter an "array substrate") formed with a pixel electrode and a thin film transistor (TFT) for supplying a display signal to the pixel electrode, a counter substrate formed with a common electrode, and a liquid crystal layer held between the TFT array substrate and the counter substrate. The liquid crystal display devices have a TN (Twisted Nematic) mode for driving liquid crystal through an electric field of a vertical direction (direction vertical to a surface of the array substrate and the counter electrode) generated between the pixel electrode and the common electrode, and a VA (Vertical Alignment) mode. Further, in recent years, liquid crystal display devices which employ an IPS (In-Plane Switching) mode ("IPS" is a registered trademark) and an FFS (Fringe Field Switching) mode have been put to practical use. In these modes, both a pixel electrode and a common electrode are disposed on an array substrate and liquid crystal is driven by an electric field of a lateral direction generated between the pixel electrode and the common electrode.

Japanese Patent Application Laid-Open No. 2009-128397, for example, proposes a structure where in a liquid crystal display panel of the FFS mode, a thick insulating film (flattening film) is formed on a source wiring (display signal line) and a portion above the source wiring is covered with a common electrode. With this structure, a source wiring type common electrode shields an electric field from a pixel, and simultaneously reduces a parasitic capacitance between the pixel and the source wirings so as to be capable of reducing power consumption of the liquid crystal panel.

In the liquid crystal display panel of the FFS mode, the pixel electrode and the common electrode are formed on different layers. For this reason, a dry etching process needs to be executed at least twice in order to form a first aperture (contact hole) for connecting a common electrode to a wiring (common wiring) for supplying a potential to the common electrode, and a second aperture for connecting a pixel electrode to a drain electrode of TFT for supplying a display signal to the pixel electrode.

Further, when a flattening film on the drain electrode of TFT is removed at the step of forming the first aperture before the step of forming the second aperture, the surface of the drain electrode is damaged twice by dry etching for forming the first aperture and dry etching for forming the second aperture. This occasionally causes an increase in contact resistance between the pixel electrode and the drain electrode. On the other hand, when the first aperture and the second aperture are formed simultaneously, one more aperture should be formed in order to connect the common electrode to the common wiring, and thus an area ratio of the contact hole within a pixel region increases.

Further, when a flattening film (organic flattening film) whose material is organic resin is used, the organic flattening film remains on a region other than the apertures of terminal portions. For this reason, a new countermeasure against the reduction in adhesion of packaging is necessary.

SUMMARY OF THE INVENTION

It is an object of the present invention to reduce a step load while suppressing the increase in the area of the contact holes on a thin film transistor array substrate having a structure with a flattening film, and simultaneously obtain stable contact resistance.

A thin film transistor array substrate of the present invention includes a thin film transistor formed on a substrate, a common wiring formed on a substrate, a first interlayer insulating film formed on the thin film transistor and the common wiring, a second interlayer insulating film formed on the first interlayer insulating film, a common electrode formed on the second interlayer insulating film, a third interlayer insulating film formed on the common electrode, and a pixel electrode formed on the third interlayer insulating film. The pixel electrode is connected to a drain electrode of the thin film transistor via a first aperture formed on the second interlayer insulating film, a second aperture that includes a bottom portion of the first aperture and is formed on the common electrode, and a third aperture that is included in the bottom portion of the first aperture and is formed on the first interlayer insulating film and the third interlayer insulating film. The common electrode is connected indirectly to the common wiring via a fourth aperture formed on the second interlayer insulating film and a fifth aperture that is included in a bottom portion of the fourth aperture and is formed on the first interlayer insulating film. At least a part of the common electrode is exposed from the third interlayer insulating film on an inner wall of the fourth aperture. The common electrode and the common wiring are connected via a contact electrode that is connected between a portion of the common electrode formed on the inner wall of the fourth aperture and the common wiring exposed on the fifth aperture, and is made of a conductive film on the same layer as the pixel electrode.

In the present invention, even when the structure where a thick insulating film is formed on a source wiring is adopted, a reduction in an aperture ratio of the pixel can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view of a pixel of the array substrate according to the first preferred embodiment;

FIG. 10 and FIG. 11 are cross-sectional views each illustrating the step of manufacturing the array substrate according to the first preferred embodiment;

FIG. 12 is a plan view illustrating the step of manufacturing the array substrate according to the first preferred embodiment;

FIG. 13 and FIG. 14 are cross-sectional views each illustrating the step of manufacturing the array substrate according to the first preferred embodiment;

FIG. 15 is a plan view illustrating the step of manufacturing the array substrate according to the first preferred embodiment;

FIG. 19 is a plan view of a pixel of an array substrate according to a second preferred embodiment;

FIG. 26 is a plan view of a pixel of an array substrate according to a modified example of the second preferred embodiment;

FIG. 27 is a cross-sectional view of a main section of the array substrate according to the modified example of the second preferred embodiment;

FIG. 37 is a cross-sectional view of a main section of the array substrate according to the modified example of the third preferred embodiment;

DESCRIPTION OF THE PREFERRED EMBODIMENTS

First Preferred Embodiment

Preferred embodiments of the present invention will be described. The following preferred embodiments are one example, and an application of the present invention is not limited to the following preferred embodiments. Further, components having similar functions in each of the drawings are denoted by the same symbols, and redundant description thereof will be appropriately omitted.

Figure 1:
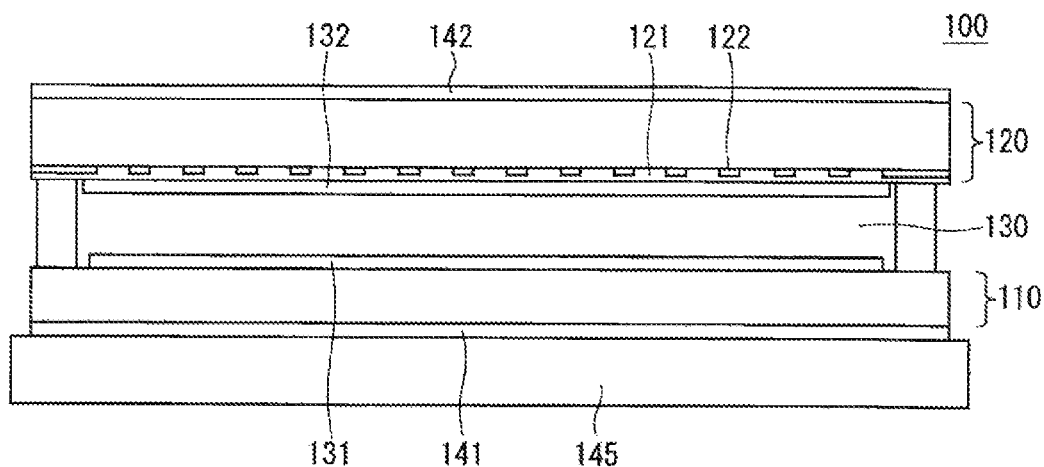
FIG. 1 is a cross-sectional view illustrating a configuration of a liquid crystal display device according to a first preferred embodiment.

FIG. 1 is a cross-sectional view illustrating a configuration of a liquid crystal display device 100 according to a first preferred embodiment. The liquid crystal display device 100 has a liquid crystal display panel structured such that an array substrate 110 and a counter substrate 120 are disposed so as to be opposed to each other, and a liquid crystal layer 130 is held between the array substrate 110 and the counter substrate 120. The counter substrate 120 disposed on a front side (visible side) in the liquid crystal display panel is a color filter substrate having, for example, a color filter 121 and a black matrix 122 (BM). Further, the array substrate 110 disposed on a rear side (anti-visible side) is a thin film transistor array substrate where, for example, TFTs are arranged into an array pattern (matrix pattern). Orientation films 131 and 132 are formed on surfaces of the array substrate 110 and the counter substrate 120 on sides of the liquid crystal layer 130, respectively.

Optical films 141 and 142 such as a polarization plate and a phase difference plate are provided on a front side of the array substrate 110 and a rear side of the counter substrate 120, respectively. Further, a backlight unit 145 is disposed on a rear side of the optical film 142.

Figure 2:
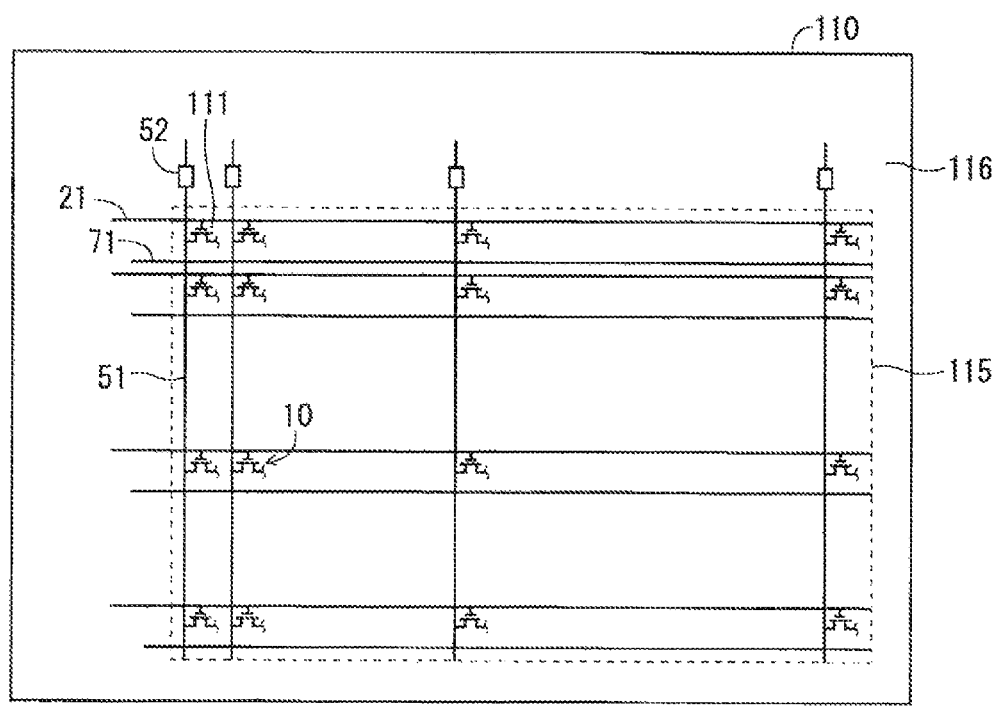
FIG. 2 is a plan view illustrating a configuration of an array substrate according to the first preferred embodiment.

FIG. 2 is a plan view illustrating a configuration of the array substrate 110. The array substrate 110 is divided into a display region 115 where pixels 111 having TFTs 10, respectively, are arranged into a matrix pattern, and a frame region 116 that surrounds an outside of the display region 115. A plurality of gate wirings 21 (scanning signal lines) and a plurality of source wirings 51 (display signal lines) are disposed on the display region 115. The plurality of gate wirings 21 are disposed parallel with each other, and also the plurality of source wirings 51 are disposed parallel with each other. The plurality of gate wirings 21 and the plurality of source wirings 51 intersect with each other. Since a region surrounded by the adjacent gate wirings 21 and the adjacent source wirings 51 becomes the pixel 111, the pixels 111 are arranged on the display region 115 into a matrix pattern. A detailed structure of the pixels 111 is described later.

In this preferred embodiment, a common wiring 71 for supplying a potential (common potential) decided in advance to a common electrode (not shown) of the pixels 111 is provided so as to be parallel with the gate wirings 21. The common wiring 71 may be provided parallel with the source wirings 51 depending on an aperture ratio design of the pixels 111.

Although illustration is omitted, in the frame region 116, a terminal for connecting an external wiring is provided to each of ends of lead-out wirings extending from the gate wirings 21 and the source wirings 51, respectively. In this preferred embodiment, these terminals are made of a conductive film on the same layer as the gate wirings 21. For this reason, the array substrate 110 in FIG. 2 has a wiring converter 52 for connecting lead-out wirings on the same layer as the source wirings 51 to lead-out wirings on the same layer as the gate wirings 21 on the frame region 116.

The TFT 10 functions as a switching element for supplying a display voltage (display signal) to a pixel electrode (not shown) of the pixel 111. An on/off operation of the TFT 10 is controlled by a gate signal (scanning signal) to be supplied from the gate wiring 21 to a gate electrode of the TFT 10. When the TFT 10 is turned on, a display voltage supplied from the source wirings 51 to a drain electrode of the TFT 10 is applied to the pixel electrode, and an electric field according to the display voltage is generated between the pixel electrode and the common electrode. This electric field drives liquid crystal of the liquid crystal layer 130, and its orientation direction changes.

When the orientation direction of the liquid crystal changes, a polarization state of light passing through the liquid crystal changes. Therefore, as to the light from the backlight unit 145 that passes through the optical film 141 on the side of the array substrate 110 and becomes linearly polarized light, the polarization state changes when this light passes through the liquid crystal layer 130. A quantity of the light passing through the optical film 142 on the side of the counter substrate 120 changes according to the polarization state of the light passing through the liquid crystal layer 130. The orientation direction of the liquid crystal changes according to the display voltage applied to the pixel electrode. Therefore, when the display voltage is controlled, the quantity of the light passing through the optical film 142 can be controlled. In the liquid crystal display device 100, the display voltage to be applied to each pixel 111 is controlled based on display data so that a desired image is displayed.

Figure 4:
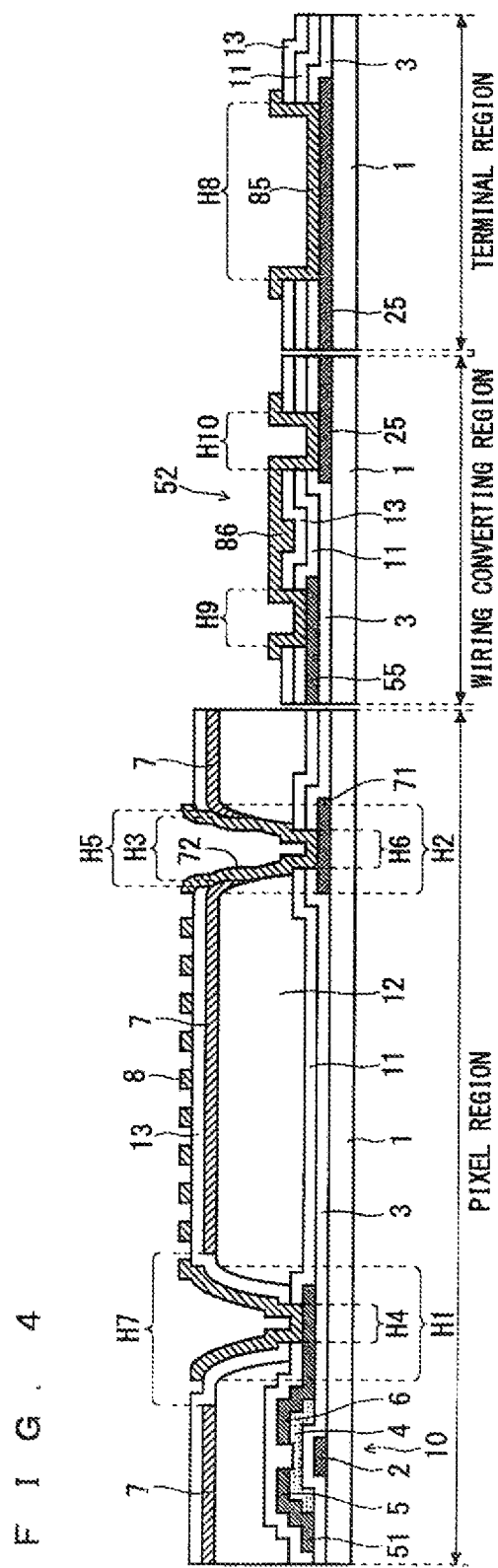
FIG. 4 is a cross-sectional view of a main section of the array substrate according to the first preferred embodiment.

The more detailed configuration of the array substrate 110 according to the first preferred embodiment is described below with reference to FIG. 3 and FIG. 4. FIG. 3 is a view illustrating a plan configuration of the pixel 111 on the array substrate 110, and FIG. 4 is a view illustrating a cross-sectional configuration of the liquid crystal display device 100. FIG. 4 illustrates cross sections of a formation region (pixel region) of the pixel 111, a formation region (terminal region) of a terminal provided at the end of the gate wiring 21 or the source wiring 51, and a formation region (wiring converting region) of the wiring converter 52 for connecting a lead-out wiring 55 of the source wiring 51 to a lead-out wiring 25 on the same layer as the gate wiring 21. The cross section of the pixel region in FIG. 4 corresponds to a cross section taken along line A1-A2 of FIG. 3.

The array substrate 110 is formed by using a substrate 1 as a transparent insulating substrate such as glass as shown in FIG. 4. A gate electrode 2 of the TFT 10, the gate wiring 21, and the common wiring 71 are formed on the pixel region of the substrate 1, and the lead-out wiring 25 on the same layer as the gate wiring 21 is formed on the terminal region and the wiring converting region. These are made of the same first conductive film. The gate electrode 2 is a part of the gate wiring 21. Specifically, a portion that is branched from the gate wiring 21 and extends to the formation region of the TFT 10 is the gate electrode 2.

An insulating film 3 is formed on the gate electrode 2, the gate wiring 21, the common wiring 71, and the lead-out wiring 25. Since the insulating film 3 functions as a gate insulating film of the TFT 10, hereinafter it is called "the gate insulating film 3".

A semiconductor film 4 is formed on the gate insulating film 3 so as to overlap with the gate electrode 2. A source electrode 5 and a drain electrode 6 of the TFT 10 are formed on the semiconductor film 4. Further, on the gate insulating film 3, the source wiring 51 to be connected to the source electrode 5 is formed on the pixel region, and the lead-out wiring 55 to be connected to the source wiring 51 extends to the wiring converting region. The source electrode 5, the drain electrode 6, the source wiring 51 and the lead-out wiring 55 are made of the same second conductive film. The source electrode 5 is a part of the source wiring 51. Specifically, the portion that is branched from the source wiring 51 and extends to the formation region (above the semiconductor film 4) of the TFT 10 is the source electrode 5.

A first interlayer insulating film 11 is formed on the semiconductor film 4, the source electrode 5, the drain electrode 6, the source wiring 51, and the lead-out wiring 55. Further, a second interlayer insulating film 12 (flattening film) having large thickness and made of, for example, a photosensitive organic resin film is formed on the first interlayer insulating film 11. However, the second interlayer insulating film 12 is removed from the terminal region, the wiring converting region, and regions around their regions.

The second interlayer insulating film 12 is formed with an aperture H1 that is disposed on a position corresponding to the drain electrode 6 and reaches the first interlayer insulating film 11, and an aperture H2 that is disposed on a position corresponding to the common wiring 71 and reaches the first interlayer insulating film 11. Since the apertures H1 and H2 are formed by exposure of the organic resin film, as shown in FIG. 4, inner walls of the apertures H1 and H2 (side surface of the second interlayer insulating film 12) have a gentle inclined plane. Shapes of the apertures H1 and H2 in the plan views represent outlines of bottom portions of the apertures H1 and H2.

A plate-shaped common electrode 7 made of a first transparent conductive film is formed on the second interlayer insulating film 12. The common electrode 7 is formed with an aperture H7 that is disposed on a position corresponding to the drain electrode 6 and includes a bottom portion of the aperture H1 of the second interlayer insulating film 12, and an aperture H3 that is disposed on a position corresponding to the common wiring 71 and is included in the aperture H2 of the second interlayer insulating film 12. As shown in FIG. 3, an end portion of the aperture H3 is positioned on an inclined plane of the inner wall of the aperture H2, and the common electrode 7 is partially formed on the inner wall of the aperture H2.

A third interlayer insulating film 13 is formed on the common electrode 7. The third interlayer insulating film 13 is formed with an aperture H4 that is disposed on a position corresponding to the drain electrode 6 and is included in the aperture H7 of the common electrode 7, and an aperture H5 that is disposed on a position corresponding to the common wiring 71 and includes the aperture H3 of the common electrode 7. The aperture H4 penetrates also the first interlayer insulating film 11 below the third interlayer insulating film 13, and reaches the drain electrode 6. Since the aperture H5 is larger than the aperture H3, the common electrode 7 exposed on the inner wall of the aperture H2 is exposed in the aperture H5. Further, an aperture H6 that is included in the bottom portion of the aperture H2 and penetrates the first interlayer insulating film 11 and the gate insulating film 3 so as to reach the common wiring 71 is formed in the aperture H3.

A pixel electrode 8 and a contact electrode 72, which are made of a second transparent conductive film, are formed on the third interlayer insulating film 13. The pixel electrode 8 has a lattice or comb-tooth shape with a slit, and is partially connected to the drain electrode 6 via the aperture H4. Further, the contact electrode 72 is formed so as to cover the aperture H5, and is connected to the common electrode 7 exposed in the aperture H5, and also to the common wiring 71 via the aperture H6. In other words, the contact electrode 72 electrically connects the common wiring 71 and the common electrode 7.

The pixel electrode 8 is connected to the drain electrode 6 of the TFT 10 via the aperture H1 formed on the second interlayer insulating film 12, the aperture H7 that includes the bottom portion of the aperture H1 and is formed on the common electrode 7, and the aperture H4 that is included in the bottom portion of the aperture H1 and is formed on the first interlayer insulating film 11 and the third interlayer insulating film 13. Further, the common electrode 7 is electrically connected to the common wiring 71 by the contact electrode 72 via the aperture H2 formed on the second interlayer insulating film 12 and the aperture H6 that is included in the bottom portion of the aperture H2 and is formed on the first interlayer insulating film 11.

An aperture H8 that penetrates the gate insulating film 3, first interlayer insulating film 11, and the third interlayer insulating film 13 to reach the lead-out wiring 25 is formed on the terminal region. Further, a pad 85 to be connected to the lead-out wiring 25 via the aperture H8 is formed on the third interlayer insulating film 13 by using a second transparent conductive film that is the same as the pixel electrode 8.

On the other hand, the wiring converting region is formed with an aperture H9, which penetrates the first interlayer insulating film 11 and the third interlayer insulating film 13 to reach the lead-out wiring 55 on the same layer as the source wiring 51, and an aperture H10, which penetrates the gate insulating film 3, the first interlayer insulating film 11, and the third interlayer insulating film 13 so as to reach the lead-out wiring 25 on the same layer as the gate wiring 21. Further, a connection pattern 86, which is connected to the lead-out wiring 55 via the aperture H9 and is connected to the lead-out wiring 25 via the aperture H10, is formed on the third interlayer insulating film 13 by using the same second transparent conductive film as the pixel electrode 8. The connection pattern 86 is formed across the aperture H9 and the aperture H10, and electrically connects the lead-out wiring 25 and the lead-out wiring 55.

In the configuration shown in FIG. 3 and FIG. 4, on the pixel region, an area of the contact hole necessary for connection between the common wiring 71 and the common electrode 7 can be reduced, and an aperture ratio of the array substrate 110 can be heightened. When the aperture ratio of the array substrate 110 can be heightened, loss of the light in the liquid crystal display panel can be made to be small. For this reason, luminance of the light to be output to the backlight unit 145 can be set small, and power consumption can be reduced.

Further, the second interlayer insulating film 12 (for example, an organic resin film) is removed on the terminal region so that adhesion between the array substrate 110 and its mounting member can be improved, and the liquid crystal display device 100 with high reliability can be provided.

A method for manufacturing the liquid crystal display device 100 according to the first preferred embodiment is described below with reference to FIG. 5 to FIG. 16.

At first, the first conductive film (for example, Al-based alloy with thickness of 200 nm) is deposited into a film thickness of 200 nm on the substrate 1 by using a sputtering method. A resist mask is formed by a first photoengraving step, and the first conductive film is patterned by etching using the resist mask as a mask, so that the gate electrode 2, the gate wirings 21, the common wiring 71, and the lead-out wirings 25 are formed. The Al alloy can be etched by using, for example, a mixed solution of phosphoric acid, nitric acid, and acetic acid. Thereafter, the resist mask is removed by using a stripping solution.

The gate insulating film 3 (for example, silicon nitride with a thickness of 400 nm) is deposited by a CVD (Chemical Vapor Deposition) method. Further, intrinsic amorphous Si and n-type amorphous Si are deposited sequentially on the gate insulating film 3 by the CVD method. A resist mask is formed by a second photoengraving step, and the amorphous Si film is patterned by dry etching using the resist mask as a mask, so that the semiconductor film 4 of the TFT 10 is formed. Thereafter, the resist mask is removed by the stripping solution.

The second conductive film (for example, a laminated film whose upper layer is made of Al-based alloy and lower layer is made of Mo-based alloy) is deposited by a sputtering method. A resist mask is formed by a third photoengraving step, and the second conductive film is patterned by etching using resist mask as a mask, so that the source electrode 5, the drain electrode 6, the source wirings 51, and the lead-out wirings 55 are formed. The Al-based alloy and the Mo-based alloy can be etched by using, for example, the mixed solution of phosphoric acid, nitric acid, and acetic acid.

Figure 5:
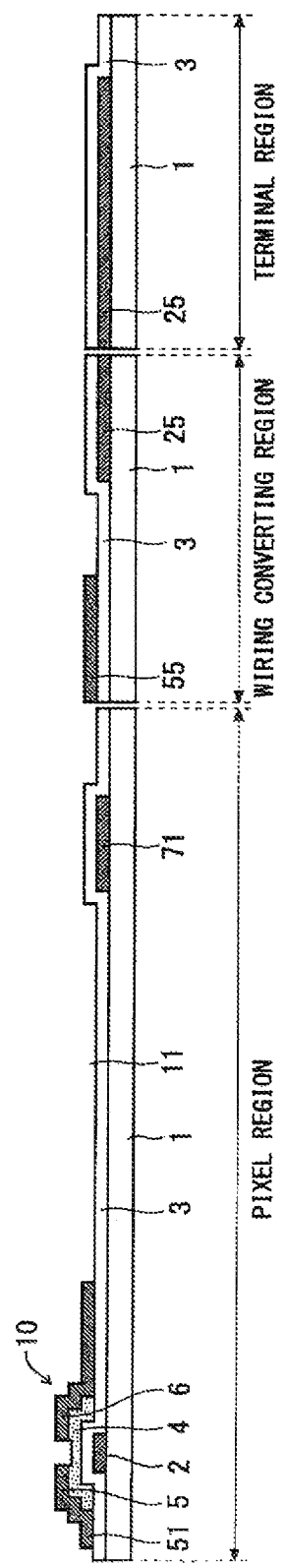
FIG. 5 is a cross-sectional view illustrating a step of manufacturing the array substrate according to the first preferred embodiment.
Figure 6:
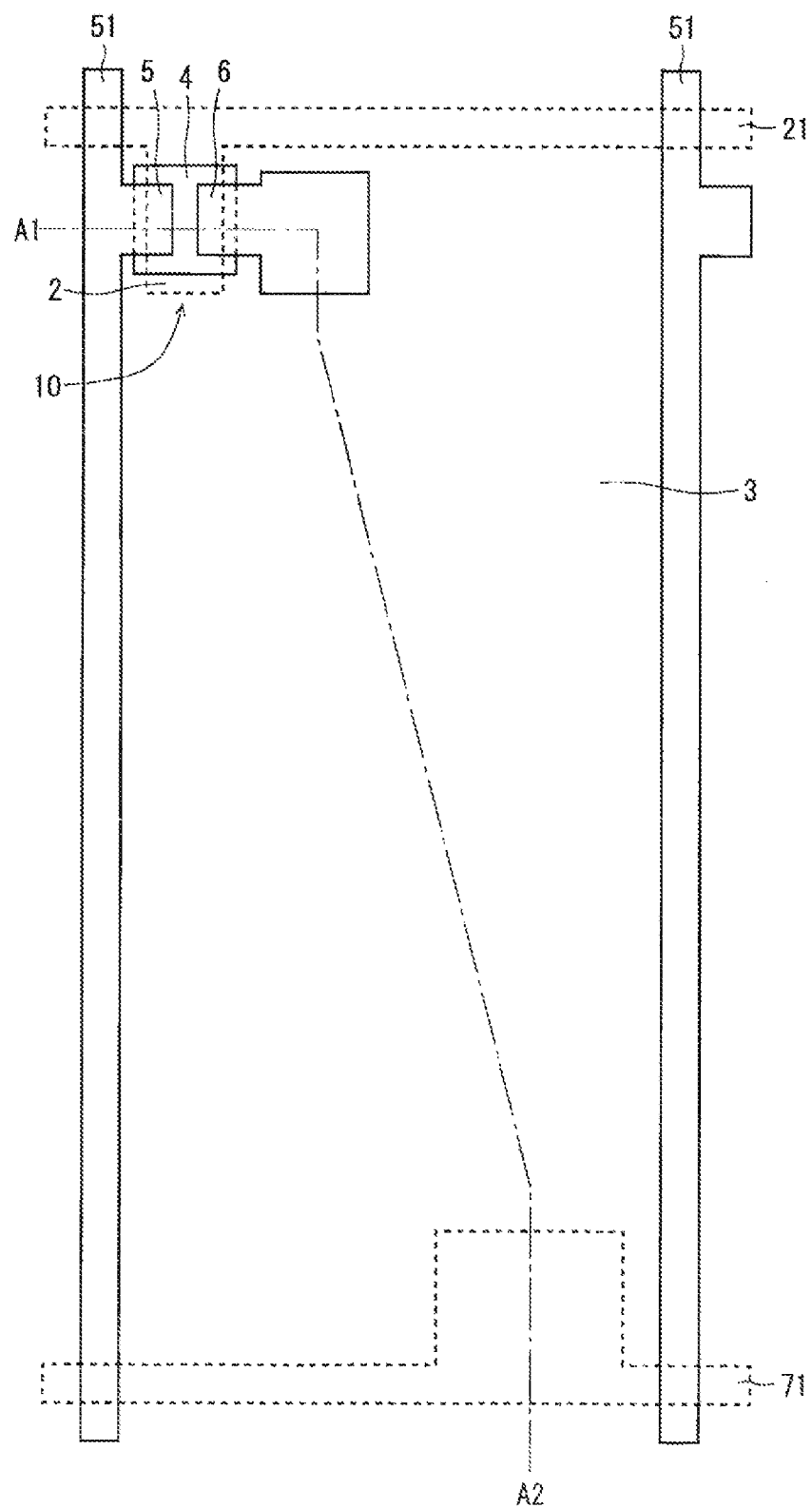
FIG. 6 is a plan view illustrating a step of manufacturing the array substrate according to the first preferred embodiment.

Thereafter, dry etching is carried out on the upper surface of the exposed semiconductor film 4. As a result, the semiconductor film 4 between the source electrode 5 and the drain electrode 6, namely, the upper surface of a channel region of the TFTs 10 is etched. Thereafter, when the resist mask is removed by the stripping solution, a state shown in FIG. 5 is obtained. Further, a top view of the pixel region in this state is illustrated in FIG. 6.

Figure 7:
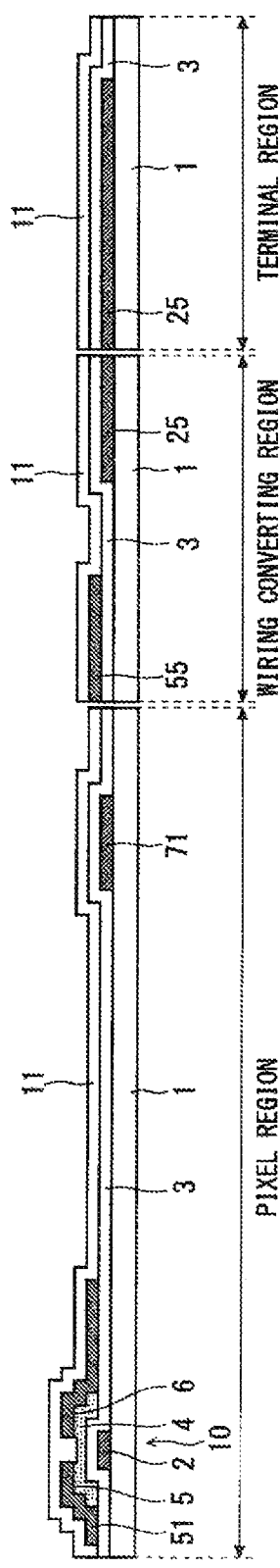
FIG. 7 and FIG. 8 are cross-sectional views each illustrating the step of manufacturing the array substrate according to the first preferred embodiment.
Figure 8:
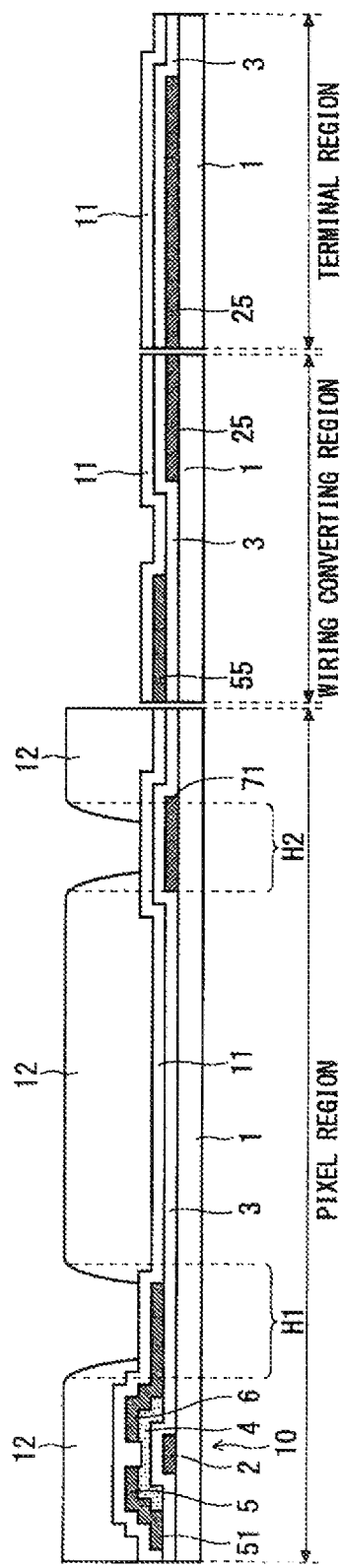
Figure 9:
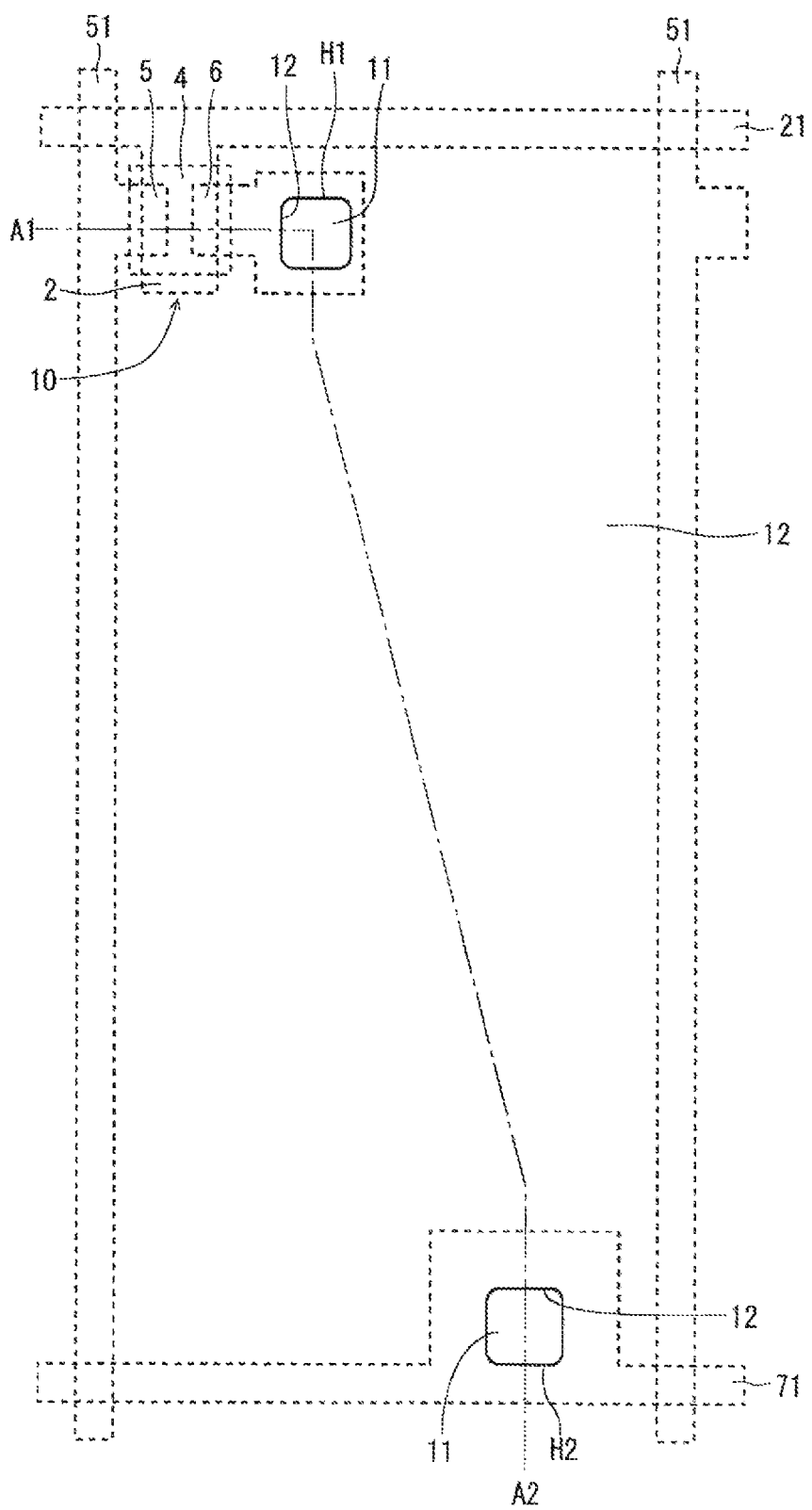
FIG. 9 is a plan view illustrating the step of manufacturing the array substrate according to the first preferred embodiment.

The first interlayer insulating film 11 (for example, silicon nitride with a thickness of 200 nm) is then deposited by the CVD method (FIG. 7). A photosensitive organic resin film is applied so that the second interlayer insulating film 12 is formed, and the second interlayer insulating film 12 is exposed to be developed at a fourth photoengraving step. As a result, the aperture H1 is formed above the drain electrode 6, and the aperture H2 is formed above the common wirings 71. At this time, the second interlayer insulating film 12 on the terminal region and the wiring converting region is also removed. As a result, a state shown in FIG. 8 is obtained. Further, a top view of the pixel region in this state is illustrated in FIG. 9. The first interlayer insulating film 11 is exposed on the bottoms of the apertures H1 and H2.

Figure 10:
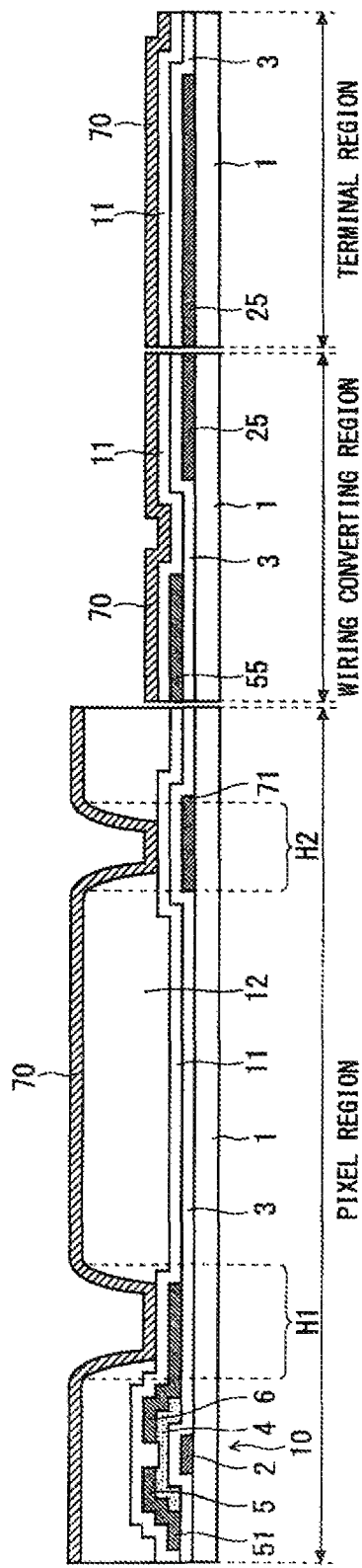

The first transparent conductive film 70 (for example, IZO with a thickness of 80 nm) is, then, deposited by the sputtering method (FIG. 10). A resist mask 201 is formed at a fifth photoengraving step, and the first transparent conductive film 70 is patterned by etching using the resist mask 201 as a mask so that the common electrode 7 is formed (FIG. 11). The IZO can be etched by using, for example, oxalic acid. At this time, on the common electrode 7, the aperture H7 is formed on a position of the second interlayer insulating film 12 corresponding to the aperture H1, and the aperture H3 is formed on a position of the second interlayer insulating film 12 corresponding to the aperture H2. The aperture H7 is formed so as to include the bottom portion of the aperture H1. Here, the aperture H7 is formed so as to be larger than the aperture H1. The aperture H3 is formed so as to be included in the aperture H2. Here, the aperture H3 is made to be larger than the bottom portion of the aperture H2, and an end portion of the aperture H3 is positioned on the inclined plane of the inner wall of the aperture H2.

Thereafter, the resist mask 201 is removed by the stripping solution. A top view of the pixel region in this state is illustrated in FIG. 12. The TFT 10, the gate wiring 21, and the source wiring 51 are covered with the common electrode 7. The first interlayer insulating film 11 at the bottom of the aperture H1 is exposed inside the aperture H7. The first interlayer insulating film 11 at the bottom of the aperture H2 is exposed inside the aperture H3.

Figure 14:
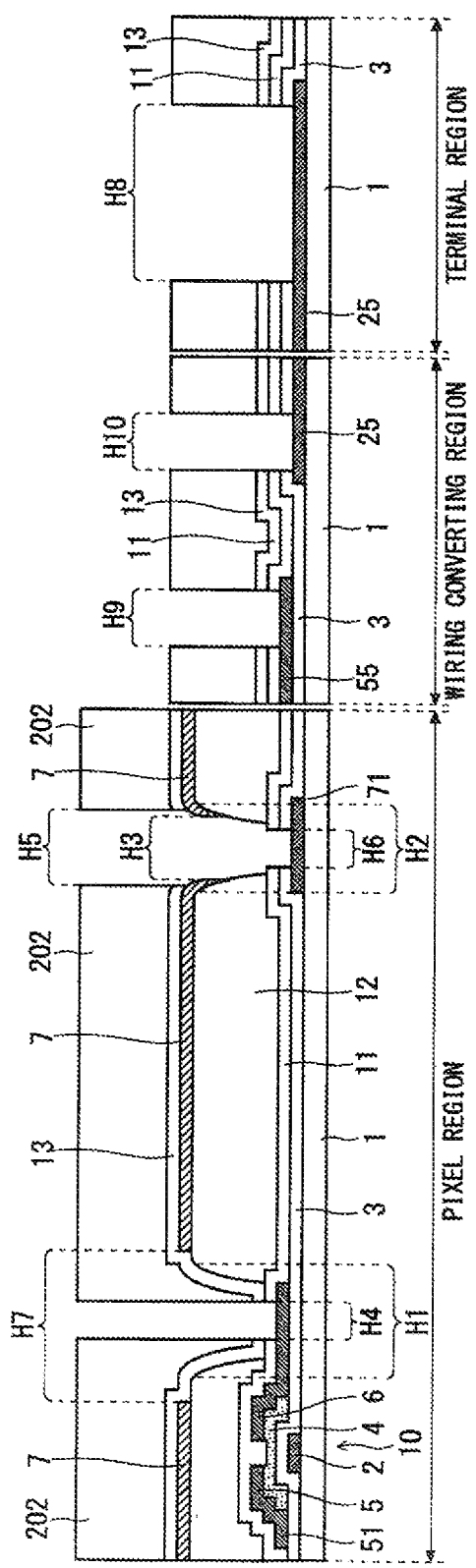

The third interlayer insulating film 13 (for example, silicon nitride with a thickness of 200 nm) is, then, deposited by the CVD method (FIG. 13). A resist mask 202 is formed at a sixth photoengraving step, and the aperture H4 included in the aperture H7 of the common electrode 7, and the aperture H5 including the aperture H3 of the common electrode 7 are formed by dry etching using the resist mask 202 as a mask. The aperture H4 is formed so as to penetrate the third interlayer insulating film 13 and the first interlayer insulating film 11 and to reach the drain electrode 6. Further, when the aperture H5 is formed on the third interlayer insulating film 13, the common electrode 7 and the second interlayer insulating film 12 are exposed at its edge portion. However, when the etching is further continued, the first interlayer insulating film 11 and the gate insulating film 3 on the bottom of the aperture H2 are removed by using the common electrode 7 and the second interlayer insulating film 12 as masks, so that the aperture H6 that reaches the common wiring 71 is formed (FIG. 14). In such a manner, since the aperture H6 is formed in a self-alignment manner by using the common electrode 7 and the second interlayer insulating film 12 as masks, its shape is similar to the bottom portion of the aperture H2.

At this etching step, the aperture H8, which reaches the lead-out wiring 25 on the same layer as the gate wiring 21, is formed on the terminal region. Further, an aperture H9, which reaches the lead-out wiring 55 on the same layer as the source wiring 51, and the aperture H10, which reaches the lead-out wiring 25 on the same layer as the gate wiring 21, are formed on the wiring converting region.

Thereafter, the resist mask 202 is removed by the stripping solution. A top view of the pixel region in this state is illustrated in FIG. 15. The drain electrode 6 of the TFT 10 is exposed on the bottom of the aperture H4. The common electrode 7 is exposed on an edge portion of the aperture H5, and the common wiring 71 is exposed on a bottom portion.

Figure 16:
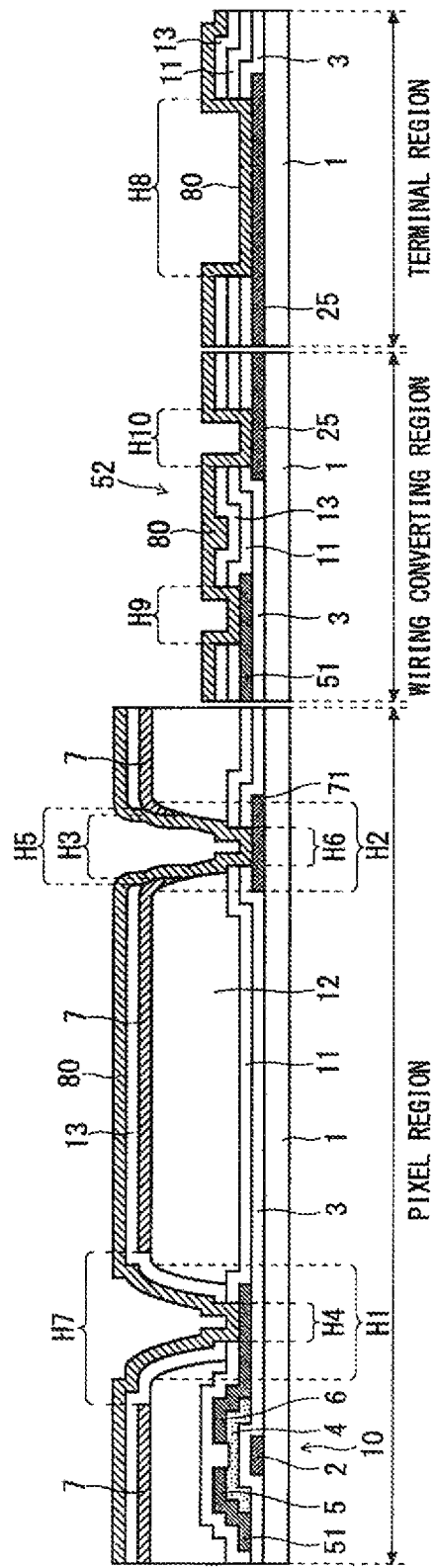
FIG. 16 is a cross-sectional view illustrating the step of manufacturing the array substrate according to the first preferred embodiment.

The second transparent conductive film 80 (for example, IZO with a thickness of 40 nm) is, then, deposited by the sputtering method (FIG. 16). A resist mask is formed at a seventh photoengraving step, and the second transparent conductive film 80 is patterned by etching using resist mask as a mask, so that the pixel electrode 8 and the contact electrode 72 are formed. At this time, the pad 85 is formed on the terminal region, and the connection pattern 86 is formed on the wiring converting region. The IZO can be etched by using, for example, oxalic acid.

Thereafter, when the resist mask is removed by a stripping solution, a configuration shown in FIG. 3 and FIG. 4 is obtained. The pixel electrode 8 is formed into the lattice or the comb-tooth shape with a slit, and is connected to the drain electrode 6 of the TFT 10 via the aperture H4 which penetrates the third interlayer insulating film 13 and the first interlayer insulating film 11. The contact electrode 72 is formed on at least a part inside the aperture H5, and electrically connects the common electrode 7 and the common wiring 71 exposed in the aperture H5.

The pad 85 on the terminal region is connected to the lead-out wiring 25 on the same layer as the gate wiring 21 via the aperture H8. The connection pattern 86 on the wiring converting region is connected to the lead-out wiring 55 on the same layer as the source wiring 51 via the aperture H9, and is connected to the lead-out wiring 25 on the same layer as the gate wiring 21 via the aperture H10. As a result, the lead-out wiring 25 and the lead-out wiring 55 are electrically connected to each other.

In a conventional method for manufacturing an array substrate having the flattening film, normally a connecting portion of the pixel electrode on the drain electrode of the TFT is subjected to the dry etching twice and wet etching once, and resist peeling three times. On the contrary, in the manufacturing method according to this preferred embodiment, the connecting portion of the pixel electrode 8 on the drain electrode 6 is subjected only to the dry etching once associated with the formation of the aperture H4, and the resist peeling once. For this reason, damage on the surface of the drain electrode 6 can be reduced.

Further, the aperture H6, which is provided on the first interlayer insulating film 11 and the gate insulating film 3 so as to reach the common wiring 71, is formed in a self-alignment manner by etching using as masks the common electrode 7 and the second interlayer insulating film 12 exposed on an edge portion of the aperture H5 of the third interlayer insulating film 13. For this reason, the sizes of the aperture H3 of the common electrode 7 and the aperture H5 of the third interlayer insulating film 13 can be set considering only alignment of the aperture H5 and the aperture H3 with respect to the aperture H2 (alignment of the aperture H6 does not have to be considered), and an area of a contact hole for connecting the common wiring 71 and the common electrode 7 can be made to be small.

In the first preferred embodiment, the Al-based alloy is used as the first conductive film, and the laminated film of Al-based alloy and Mo-based alloy is used as the second conductive film, but another material may be used. Upper layer portions of the first conductive film and the second conductive film may be the conductive film (or its laminated film) with low resistance, and a lower layer portion of the second conductive film may be the conductive film where an ohmic contact for silicon can be obtained.

A semiconductor other than amorphous Si such as IGZO or poly-Si may be used as the semiconductor film 4 of the TFT 10. An insulating film other than a silicon nitride film such as a silicon oxide film, may be used as the gate insulating film 3, the first interlayer insulating film 11, and the third interlayer insulating film 13. A transparent conductive film other than IZO such as ITO or ITZO may be used as the first transparent conductive film and the second transparent conductive film.

Further, a channel region of the TFT 10 (a portion between the source electrode 5 and the drain electrode 6 on the semiconductor film 4) is covered with the common electrode 7, but the common electrode 7 above the channel region may be removed.

In the manufacturing method according to the first preferred embodiment, the conductive film is formed by the sputtering method, and the insulating film is formed by the CVD method, but another method may be used.

Modified Example

Figure 17:
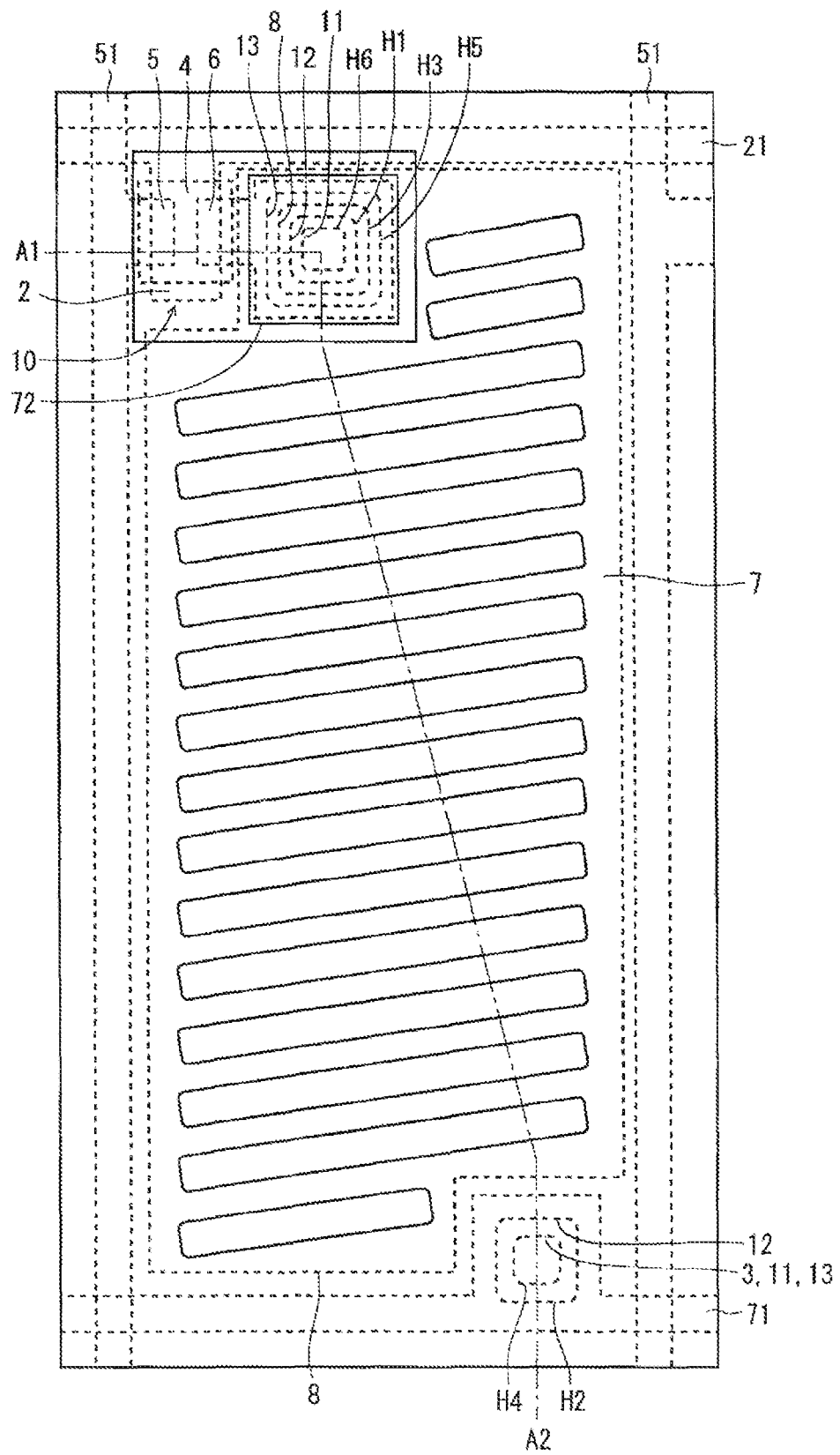
FIG. 17 is a plan view of the pixel of the array substrate according to a modified example of the first preferred embodiment.
Figure 18:
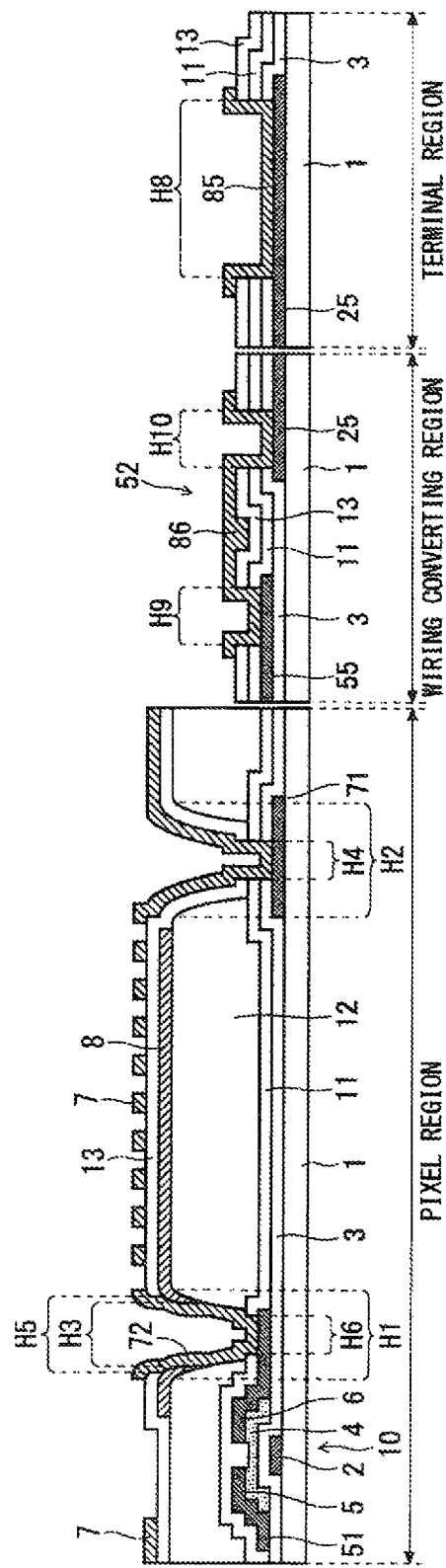
FIG. 18 is a cross-sectional view of a main section of the array substrate according to the modified example of the first preferred embodiment.

The common electrode 7 is disposed under the pixel electrode 8 as shown in FIG. 3 and FIG. 4, however, the common electrode 7 may be disposed above the pixel electrode 8. Specifically, as shown in FIG. 17 and FIG. 18, the plate-shaped pixel electrode 8 made of the first transparent conductive film is disposed on the second interlayer insulating film 12, and the common electrode 7 having the lattice or comb-tooth shape and made of the second transparent conductive film may be disposed above the pixel electrode 8. In this case, the pixel electrode 8 (the first transparent conductive film) is exposed on the inner wall of the aperture H1 of the second interlayer insulating film 12 positioned on the drain electrode 6, and the contact electrode 72 made of the second transparent conductive film is formed in the aperture H1, so that the drain electrode 6 and the pixel electrode 8 are electrically connected.

This configuration is realized by interchanging the formation position of the aperture H4 and the formation position of the apertures H3, H5, and H6 and the contact electrode 72 with each other in FIG. 3 and FIG. 4. In other words, the aperture H3 of the first transparent conductive film and the aperture H5 of the third interlayer insulating film 13 including the aperture H3 are formed on a position of the second interlayer insulating film 12 corresponding to the aperture H1. The aperture H6 of the first interlayer insulating film 11 formed in the self-alignment manner at the time of forming the aperture H5 is formed so as to reach the drain electrode 6. Further, the aperture H4 of the third interlayer insulating film 13 is formed on a position of the second interlayer insulating film 12 corresponding to the aperture H2 so as to reach the common wiring 71.

Further, the contact electrode 72 made of the second transparent conductive film is formed on at least a part inside the aperture H5, so that the drain electrode 6 is electrically connected to the pixel electrode 8. Further, a part of the common electrode 7 is formed inside the aperture H4 so that the common electrode 7 is electrically connected to the common wiring 71.

In this modified example, the common wiring 71 is made of the first conductive film and is connected to the common electrode 7 via the apertures H2 and H4, but the common electrode 7 may be used as it is as a common wiring. Further, the common wiring 71 made of a third conductive film is disposed on a higher layer than the second interlayer insulating film 12, and may be connected to the common electrode 7 via an aperture of the third interlayer insulating film 13. Further, the common wiring 71 made of the third conductive film on a higher layer than the third interlayer insulating film 13 may be disposed on an upper layer or a lower layer of the common electrode 7 so as to be connected directly to the common electrode 7. In such a configuration, the contact electrode 72 may be made of at least the conductive film on the same layer as the common wiring 71.

Second Preferred Embodiment

Figure 20:
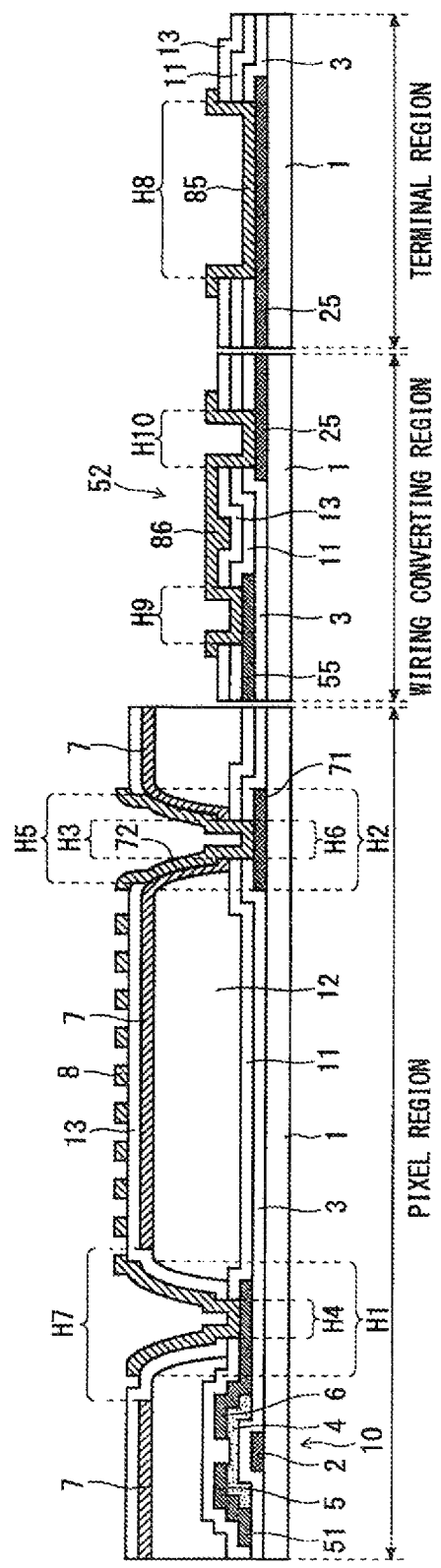
FIG. 20 a cross-sectional view of a main section of the array substrate according to the second preferred embodiment.

FIG. 19 and FIG. 20 are views illustrating a configuration of an array substrate 110 according to a second preferred embodiment. FIG. 19 is the view illustrating a plan configuration of a pixel 111 on the array substrate 110. FIG. 20 illustrates cross sections of a formation region (a pixel region) of the pixel 111 on the array substrate 110, a formation region (a terminal region) of a terminal provided to an end portion of a gate wiring 21 or a source wiring 51, and a formation region (a wiring converting region) of a wiring converter 52 for connecting the lead-out wiring 55 of the source wiring 51 to the lead-out wiring 25 on the same layer as the gate wiring 21. The cross section of the pixel region in FIG. 20 corresponds to the cross section taken along line A1-A2 shown in FIG. 19.

In the second preferred embodiment, an aperture H3 provided to a first transparent conductive film is formed so as to be included in a bottom portion of the aperture H2 of a second interlayer insulating film 12. An aperture H6, which penetrates a gate insulating film 3 and a first interlayer insulating film 11 so as to reach a common wiring 71, is formed in the aperture H3 of the first transparent conductive film in a self-alignment manner. For this reason, the shape of the aperture H6 is similar to that of the aperture H3.

Since an aperture H5 of a third interlayer insulating film 13 is formed so as to include the apertures H3 and H6, a common electrode 7 on an inner wall of the aperture H2 is exposed in the aperture H5. A contact electrode 72 made of a second transparent conductive film is formed in the aperture H5. The contact electrode 72 electrically connects the common electrode 7 exposed on an inner wall of the aperture H5 to the common wiring 71 exposed on a bottom of the aperture H6.

A configuration of a terminal region and a wiring converting region are similar to those in the first preferred embodiment.

In the second preferred embodiment, an area of the aperture H3 is smaller than that in the first preferred embodiment. Therefore, also when a pattern design rule of overlapping of the aperture H3 and the aperture H5, which defines a region where the common electrode 7 is exposed in the aperture H5, is set to be equivalent to that in the first preferred embodiment, an area of the aperture H5 can be set smaller than that in the first preferred embodiment. Therefore, an occupancy area of the contact electrode 72 is reduced, and a region of a pixel electrode 8 can be widened. As a result, an aperture ratio of the pixel 111 can be heightened, and power consumption of a backlight unit 145 can be reduced.

A method for manufacturing the liquid crystal display device 100 according to the second preferred embodiment is described. Since methods for forming the terminal region and the wiring converting region are similar to those in the first preferred embodiment, description about these methods is omitted.

First, a TFT 10, the first interlayer insulating film 11, and the second interlayer insulating film 12 are formed on a substrate 1 in the same manner as the steps described with reference to FIG. 5 to FIG. 10 in the first preferred embodiment. Apertures H1 and H2 are formed on the second interlayer insulating film 12, and the first transparent conductive film 70 is deposited on the second interlayer insulating film 12. The photoengraving step has been executed four times at this point.

Figure 21:
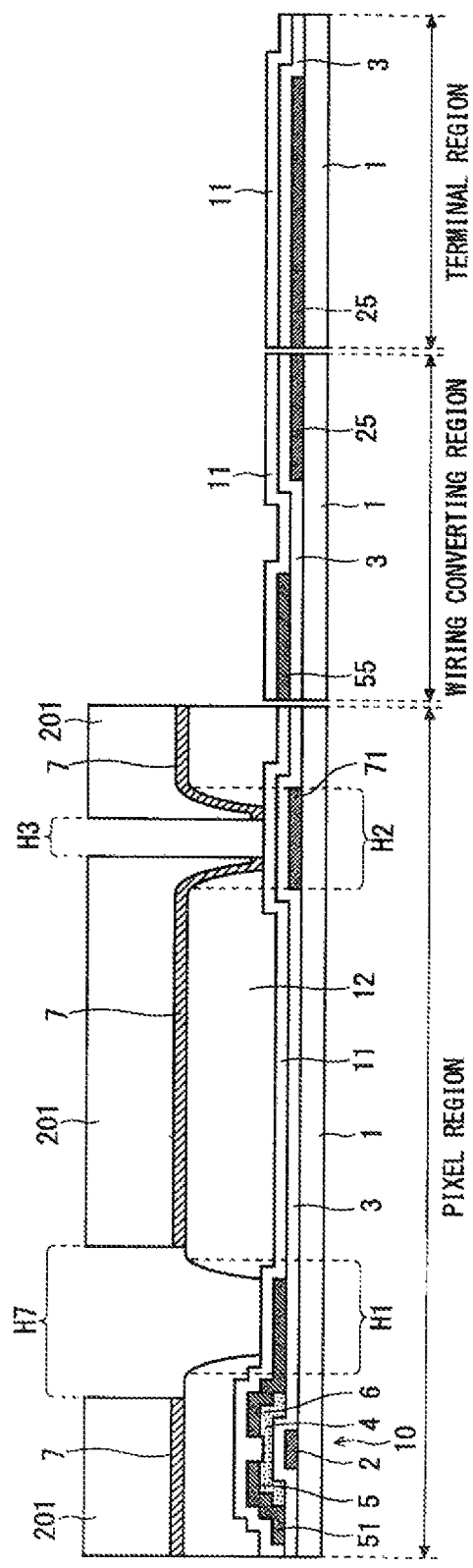
FIG. 21 is a cross-sectional view illustrating a step of manufacturing the array substrate according to the second preferred embodiment.

A resist mask 201 is formed at a fifth photoengraving step, the first transparent conductive film 70 is patterned by etching using the resist mask 201 as a mask, so that the common electrode 7 is formed (FIG. 21). At this time, on the common electrode 7, the aperture H7 is formed on a position of the second interlayer insulating film 12 corresponding to the aperture H1, and the aperture H3 is formed on a position of the second interlayer insulating film 12 corresponding to the aperture H2. The aperture H7 is formed so as to include a bottom portion of the aperture H1. The aperture H3 is formed so as to be included in the bottom portion of the aperture H2. For this reason, the common electrode 7 formed on the inner wall of the aperture H2 is not removed but remains so as to reach the bottom portion of the aperture H2.

Figure 22:
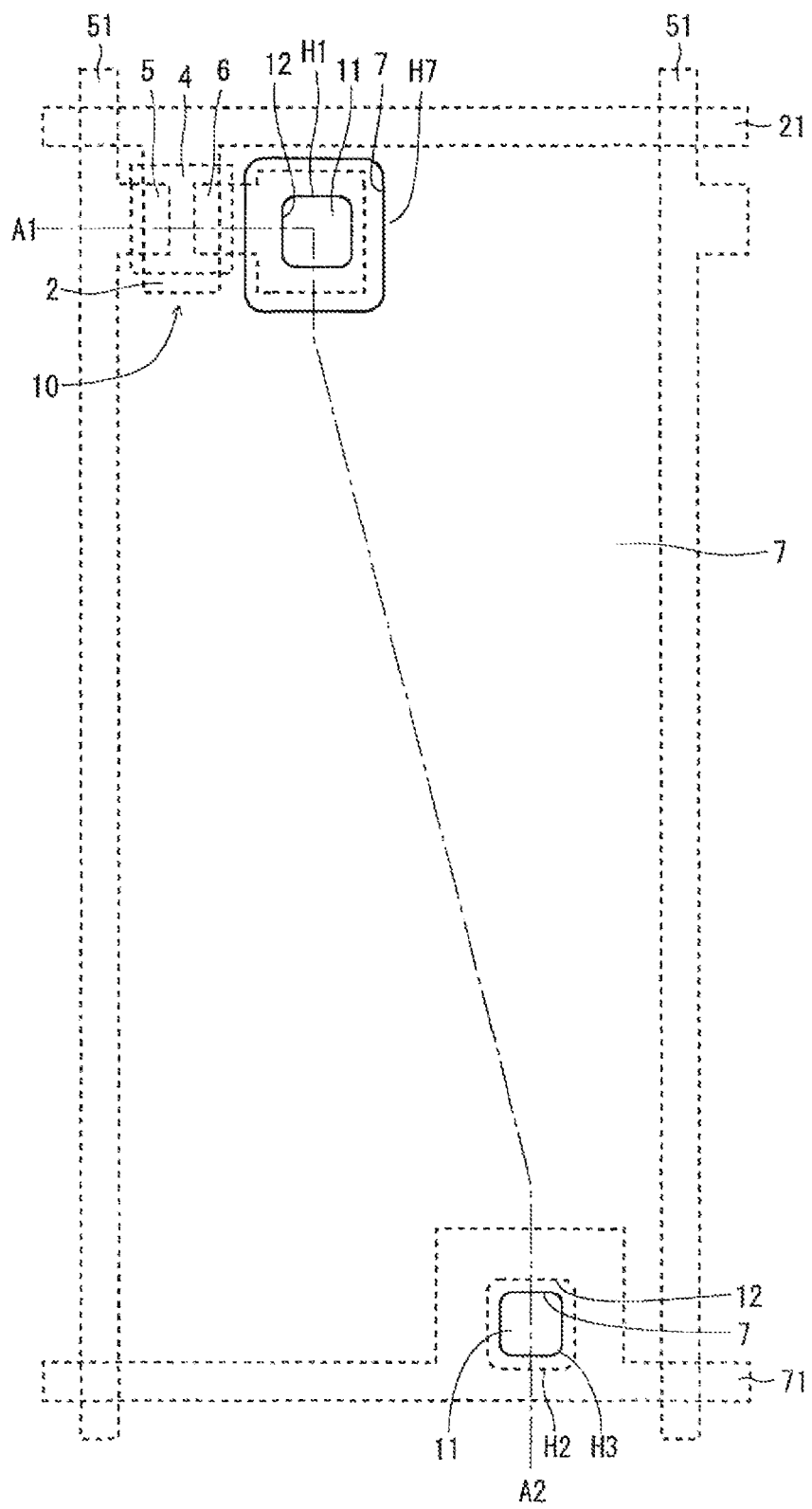
FIG. 22 is a plan view illustrating the step of manufacturing the array substrate according to the second preferred embodiment.

Thereafter, the resist mask 201 is removed by the stripping solution. A top view of a pixel region in this state is illustrated in FIG. 22. The TFT 10, the gate wiring 21, and the source wiring 51 are covered with the common electrode 7. The first interlayer insulating film 11 at the bottom of the aperture H1 is exposed inside the aperture H7. The first interlayer insulating film 11 at the bottom of the aperture H2 is exposed inside the aperture H3.

Figure 23:
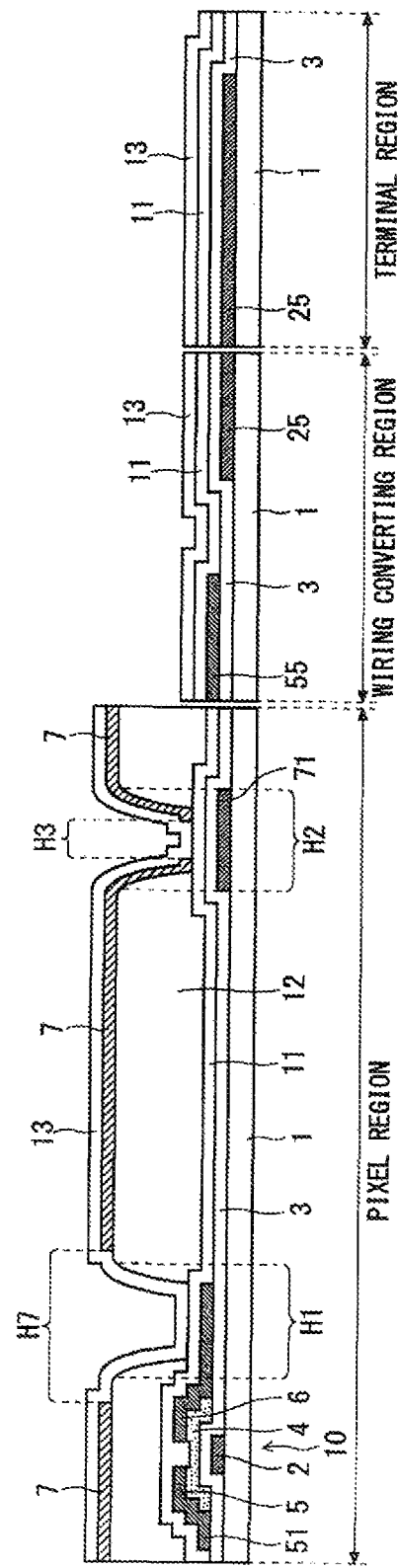
FIG. 23 and FIG. 24 are cross-sectional views each illustrating the step of manufacturing the array substrate according to the second preferred embodiment.
Figure 24:
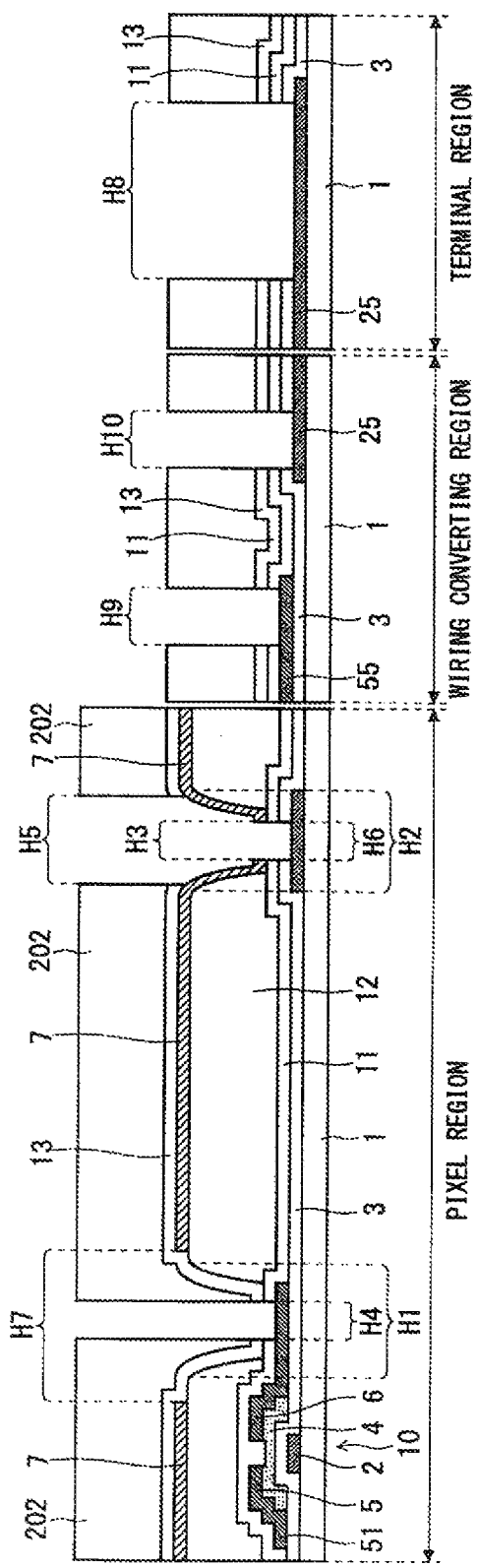

The third interlayer insulating film 13 (for example, silicon nitride with thickness of 200 nm) is then deposited by using a CVD method (FIG. 23). A resist mask 202 is formed at a sixth photoengraving step, and the aperture H4 included in the aperture H7 of the common electrode 7, and the aperture H5 including the aperture H3 of the common electrode 7 are formed by dry etching using the resist mask 202 as a mask. The aperture H4 is formed so as to penetrate the third interlayer insulating film 13 and the first interlayer insulating film 11 and reach the drain electrode 6. Further, when the aperture H5 is formed on the third interlayer insulating film 13, the common electrode 7 is exposed from its edge portion. However, when the etching is further continued, the common electrode 7 becomes a mask, and the first interlayer insulating film 11 and the gate insulating film 3 at the bottom of the aperture H2 are removed, so that the aperture H6, which reaches the common wiring 71, is formed (FIG. 24). In such a manner, since the aperture H6 is formed in a self-alignment manner by using the common electrode 7 as a mask, its shape is similar to the aperture H3.

Figure 25:
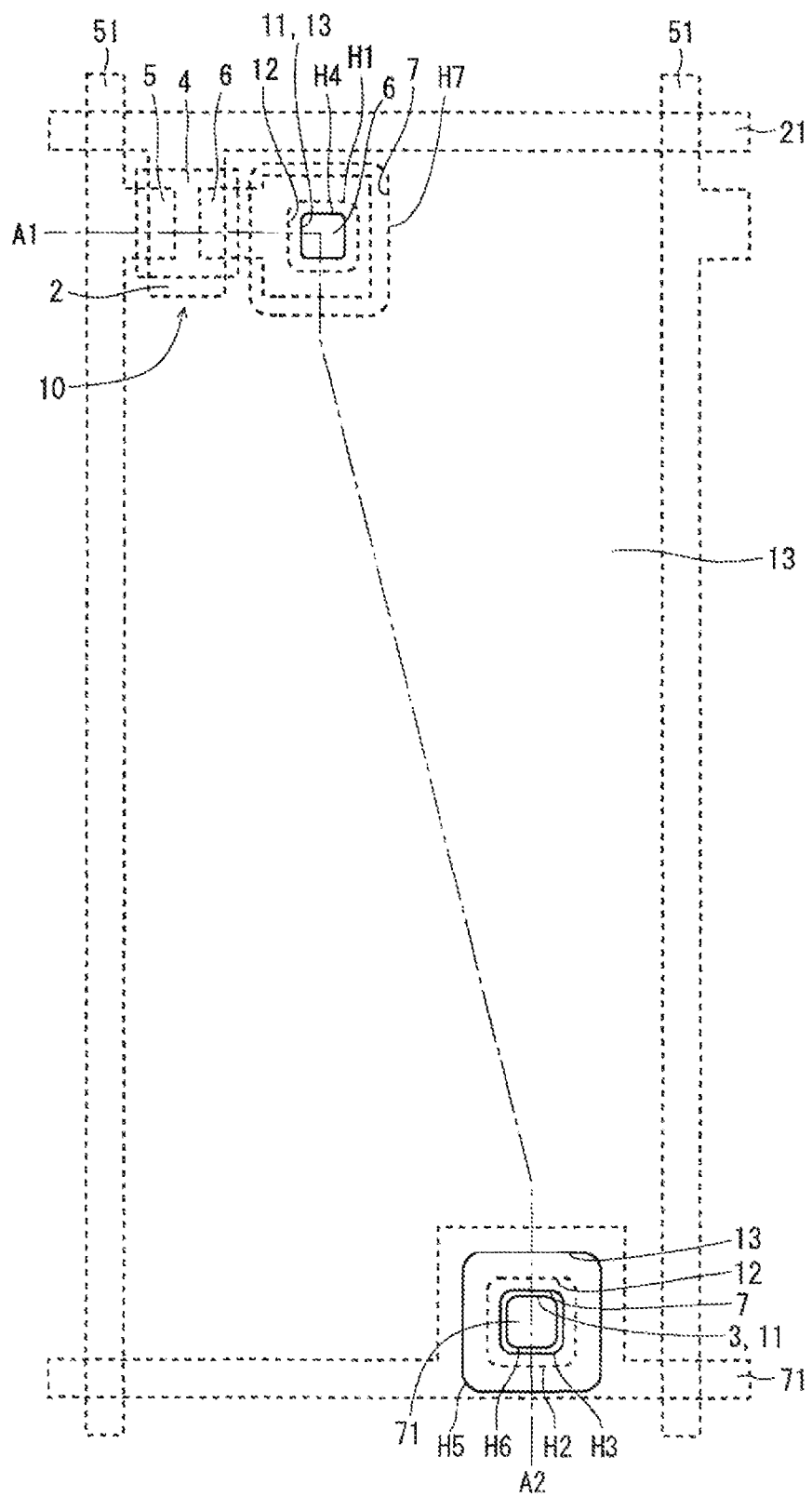
FIG. 25 is a plan view illustrating the step of manufacturing the array substrate according to the second preferred embodiment.

Thereafter, the resist mask 202 is removed by the stripping solution. A top view of the pixel region in this state is illustrated in FIG. 25. The drain electrode 6 of the TFT 10 is exposed on the bottom of the aperture H4. The common electrode 7 is exposed on an edge portion of the aperture H5, and the common wiring 71 is exposed on a bottom portion.

The second transparent conductive film is deposited in the same manner as the step described with reference to FIG. 16 in the first preferred embodiment. A resist mask is formed at a seventh photoengraving step, and the second transparent conductive film is patterned by etching using the resist mask as a mask, so that the pixel electrode 8 and the contact electrode 72 are formed. The pixel electrode 8 is connected to the drain electrode 6 of the TFT 10 via the aperture H4 which penetrates the third interlayer insulating film 13 and the first interlayer insulating film 11. The contact electrode 72 is formed on at least a part inside the aperture H5, and electrically connects the common electrode 7 and the common wiring 71 exposed in the aperture H5.

Thereafter, the resist mask is removed by the stripping solution, so that a configuration shown in FIG. 19 and FIG. 20 is obtained.

In the second preferred embodiment, since the aperture H6, which penetrates the gate insulating film 3 and the first interlayer insulating film 11, is formed inside the aperture H3 of the first transparent conductive film (common electrode 7) in a self-alignment manner, the aperture H3 can be formed stably with respect to the displacement of the resist mask 202.

Further, a channel region of the TFT 10 (a portion between the source electrode 5 and the drain electrode 6 on the semiconductor film 4) is covered with the common electrode 7, but the common electrode 7 above the channel region may be removed.

In this preferred embodiment, the aperture H3 to be provided on the first transparent conductive film is formed so as to be completely included in the bottom portion of the aperture H2 of the second interlayer insulating film 12, but the aperture H3 may be partially included in the bottom portion of the aperture H2. In this case, the common electrode 7 formed on the inner wall of the aperture H2 partially reaches the bottom portion of the aperture H2. For this reason, the aperture H6 to be formed on the first interlayer insulating film 11 and the gate insulating film 3 is formed in a self-alignment manner on a portion where the bottom portion of the aperture H2 and the aperture H3 overlap with each other. Therefore, the shape of the aperture H6 is similar to that of the aperture included in the bottom portion of the aperture H2 and the aperture H3.

Modified Example

Also in the second preferred embodiment, the common electrode 7 is disposed under the pixel electrode 8 as shown in FIG. 19 and FIG. 20, however, the common electrode 7 may be disposed above the pixel electrode 8. Specifically, as shown in FIG. 26 and FIG. 27, the plate-shaped pixel electrode 8 made of the first transparent conductive film is disposed on the second interlayer insulating film 12, and the common electrode 7 having the lattice or comb-tooth shape and made of the second transparent conductive film may be disposed above the pixel electrode 8. In this case, the pixel electrode 8 (the first transparent conductive film) is exposed on the inner wall of the aperture H1 of the second interlayer insulating film 12 positioned on the drain electrode 6, and the contact electrode 72 made of the second transparent conductive film is formed at least on a part in the aperture H5, so that the drain electrode 6 and the pixel electrode 8 are electrically connected.

This configuration is realized by interchanging the formation position of the aperture H4 and the formation position of the apertures H3, H5, and H6 and the contact electrode 72 in FIG. 19 and FIG. 20 with each other. In other words, the aperture H3 of the first transparent conductive film and the aperture H5 of the third interlayer insulating film 13 including the aperture H3 are formed on a position of the second interlayer insulating film 12 corresponding to the aperture H1. The aperture H6 of the first interlayer insulating film 11 formed in the self-alignment manner at the time of forming the aperture H5 is formed so as to reach the drain electrode 6. Further, the aperture H4 of the third interlayer insulating film 13 is formed on a position the second interlayer insulating film 12 corresponding to the aperture H2 so as to reach the common wiring 71.

Further, the contact electrode 72 made of the second transparent conductive film is formed on at least a part inside the aperture H5, so that the drain electrode 6 is electrically connected to the pixel electrode 8. Further, a part of the common electrode 7 is formed inside the aperture H4 so that the common electrode 7 is electrically connected to the common wiring 71.

In this modified example, the common wiring 71 is made of the first conductive film and is connected to the common electrode 7 via the apertures H2 and H4, but the common electrode 7 may be used as it is as a common wiring. Further, the common wiring 71 made of a third conductive film is disposed on a higher layer than the second interlayer insulating film 12, and may be connected to the common electrode 7 via an aperture of the third interlayer insulating film 13. Further, the common wiring 71 made of the third conductive film on a higher layer than the third interlayer insulating film 13 may be disposed on an upper layer or a lower layer of the common electrode 7 so as to be connected directly to the common electrode 7. In such a configuration, the contact electrode 72 may be made of at least the conductive film on the same layer as the common wiring 71.

Third Preferred Embodiment

Figure 28:
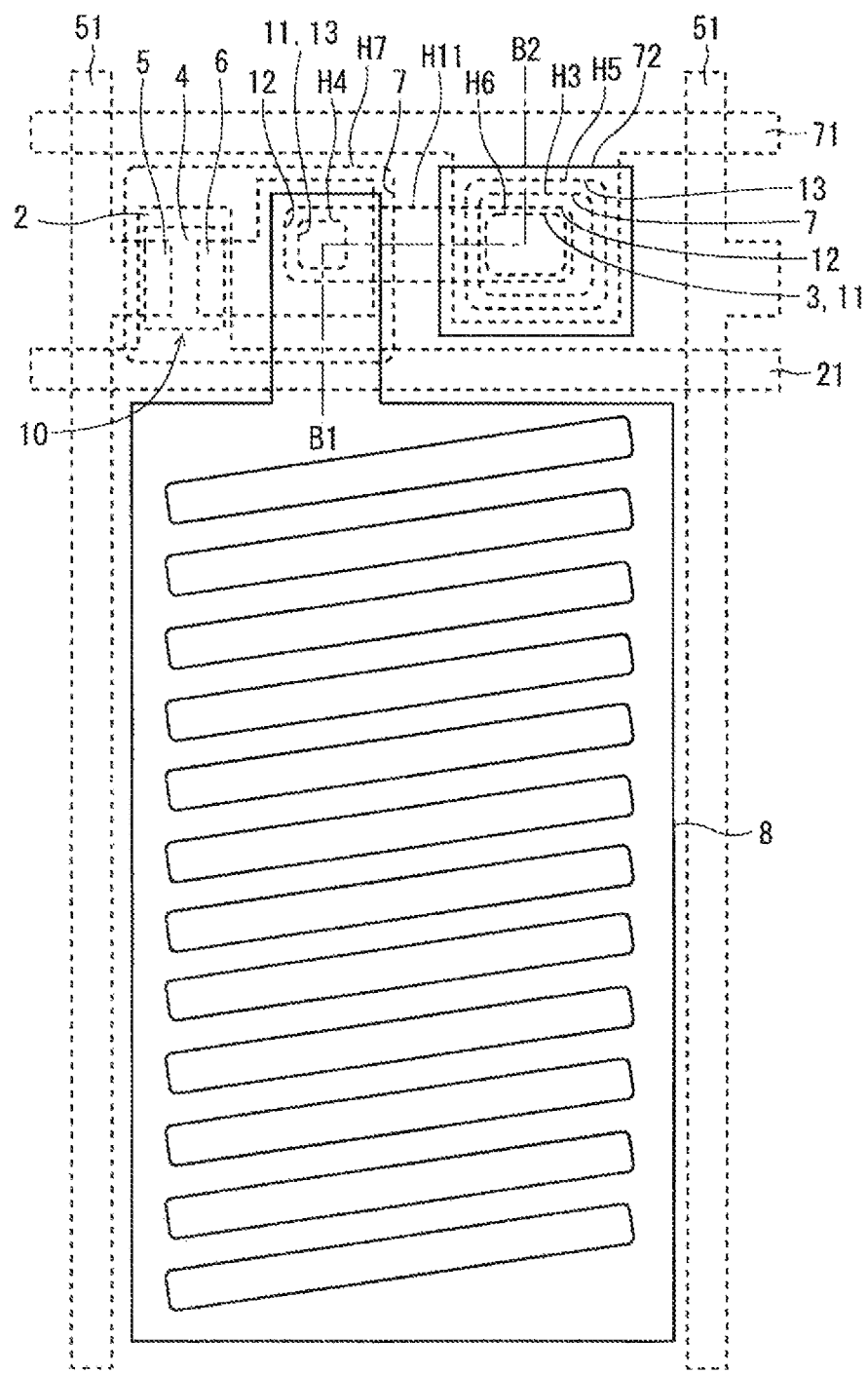
FIG. 28 is a plan view of a pixel of an array substrate according to a third preferred embodiment.
Figure 29:
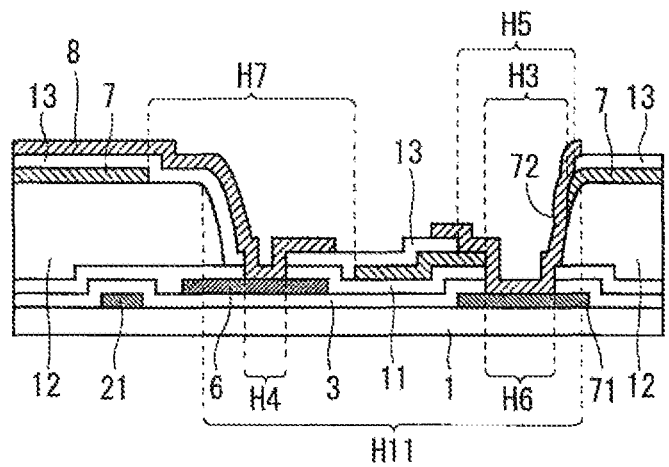
FIG. 29 is a cross-sectional view of a main section of the array substrate according to the third preferred embodiment.

FIG. 28 and FIG. 29 are views illustrating a configuration of an array substrate 110 according to the third preferred embodiment. FIG. 28 is a view illustrating a plan configuration of the pixel 111 on the array substrate 110. FIG. 29 is a view illustrating a cross-sectional configuration of a formation region (pixel region) of the pixels 111, and corresponds to the cross section taken along line B1-B2 shown in FIG. 28. Since a configuration of a formation region (terminal region) of a terminal provided to an end portion of a gate wiring 21 or a source wiring 51, and a configuration of a formation region (wiring converting region) of a wiring converter 52 for connecting a lead-out wiring 55 of the source wiring 51 to lead-out wirings 25 on the same layer as the gate wiring 21 are similar to those in the first preferred embodiment, illustration and description thereof are omitted.

In the first preferred embodiment, the aperture H1 of the second interlayer insulating film 12 provided above the drain electrode 6 is separated from the aperture H2 of the second interlayer insulating film 12 provided above a common wiring 71, but in the third preferred embodiment, the apertures H1 and H2 are formed to be connected to each other. Specifically, as shown in FIG. 28 and FIG. 29, the drain electrode 6 and the common wiring 71 are disposed so as to be close to each other, and an aperture H11 is provided on the second interlayer insulating film 12 across the drain electrode 6 and the common wiring 71. A shape of the aperture H11 in the plan view represents an outline of a bottom portion of the aperture H11.

An aperture H7 is formed on a position of a common electrode 7 made of a first transparent conductive film corresponding to the drain electrode 6, and an aperture H3 is formed on a position corresponding to the common wiring 71. The aperture H7 includes a part of a bottom portion of the aperture H11. A part of the end portion of the aperture H7 is positioned outside the bottom portion of the aperture H11. The aperture H3 is included in the aperture H11. A part of the end portion of the aperture H3 is positioned on an inclined plane of an inner wall of the aperture H11.

An aperture H4 included in the aperture H7 of the common electrode 7, and an aperture H5 including the aperture H3 of the common electrode 7 are formed on a third interlayer insulating film 13 covering the common electrode 7. The aperture H4 penetrates also a first interlayer insulating film 11 below the third interlayer insulating film 13, and reaches the drain electrode 6. Since the aperture H5 is larger than the aperture H3, a part of the common electrode 7 (a portion around the aperture H3), which is exposed on the inner wall of the aperture H11, is exposed in the aperture H5. Further, an aperture H6, which penetrates the first interlayer insulating film 11 and a gate insulating film 3 so as to reach the common wiring 71, is formed in the aperture H3.

A pixel electrode 8 and a contact electrode 72, which are made of a second transparent conductive film, are formed on the third interlayer insulating film 13. A part of the pixel electrode 8 is connected to the drain electrode 6 in the aperture H7 via the aperture H4. Further, the contact electrode 72 is connected to the common wiring 71 via the aperture H6 in the aperture H5, and also to the common electrode 7 exposed in the aperture H5. In other words, the contact electrode 72 electrically connects the common wiring 71 and the common electrode 7.

As described above, in the third preferred embodiment, the two apertures H1 and H2, which are formed on the second interlayer insulating film 12 of the pixel region in the first preferred embodiment, are replaced by one aperture H11. For this reason, the aperture area of the second interlayer insulating film 12 can be small, and thus an aperture ratio of the pixel 111 is improved. Further, an orientation failure of liquid crystal easily occurs near a level-different portion of the second interlayer insulating film 12, but a region where the orientation failure occurs is reduced by reducing the number of the apertures, so that display quality is improved. Further, a portion, which is subjected to a weak orientation process in a rubbing process of an orientation film, and a region of an orientation cloth, which is subjected to the orientation process for a long time, are reduced. The reduction in these regions can contribute to the improvement of the display quality. Particularly when a lengthwise direction of the aperture H11 is made to match with the rubbing direction, the orientation process is further improved.

A method for manufacturing a liquid crystal display device 100 according to the third preferred embodiment is described. Since methods for forming the terminal region and the wiring converting region are similar to those in the first preferred embodiment, description about these forming methods is omitted.

A TFT 10 and the first interlayer insulating film 11 are formed on a substrate 1 in the same manner as the step described with reference to FIG. 5 to FIG. 7 in the first preferred embodiment. Note that, a change in a layout is necessary in order to make the drain electrode 6 of the TFT 10 close to the common wiring 71. A photoengraving step has been executed three times at this point.

Figure 30:
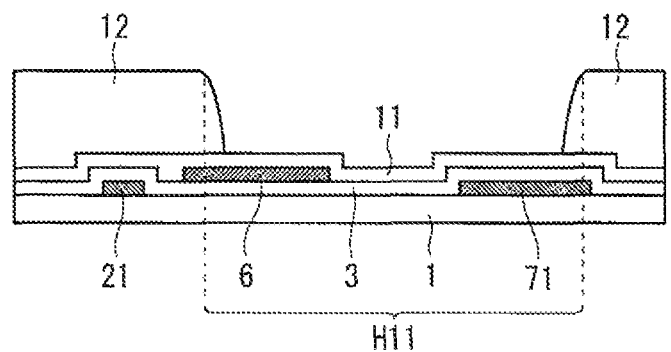
FIG. 30 is a cross-sectional view illustrating a step of manufacturing the array substrate according to the third preferred embodiment.
Figure 31:
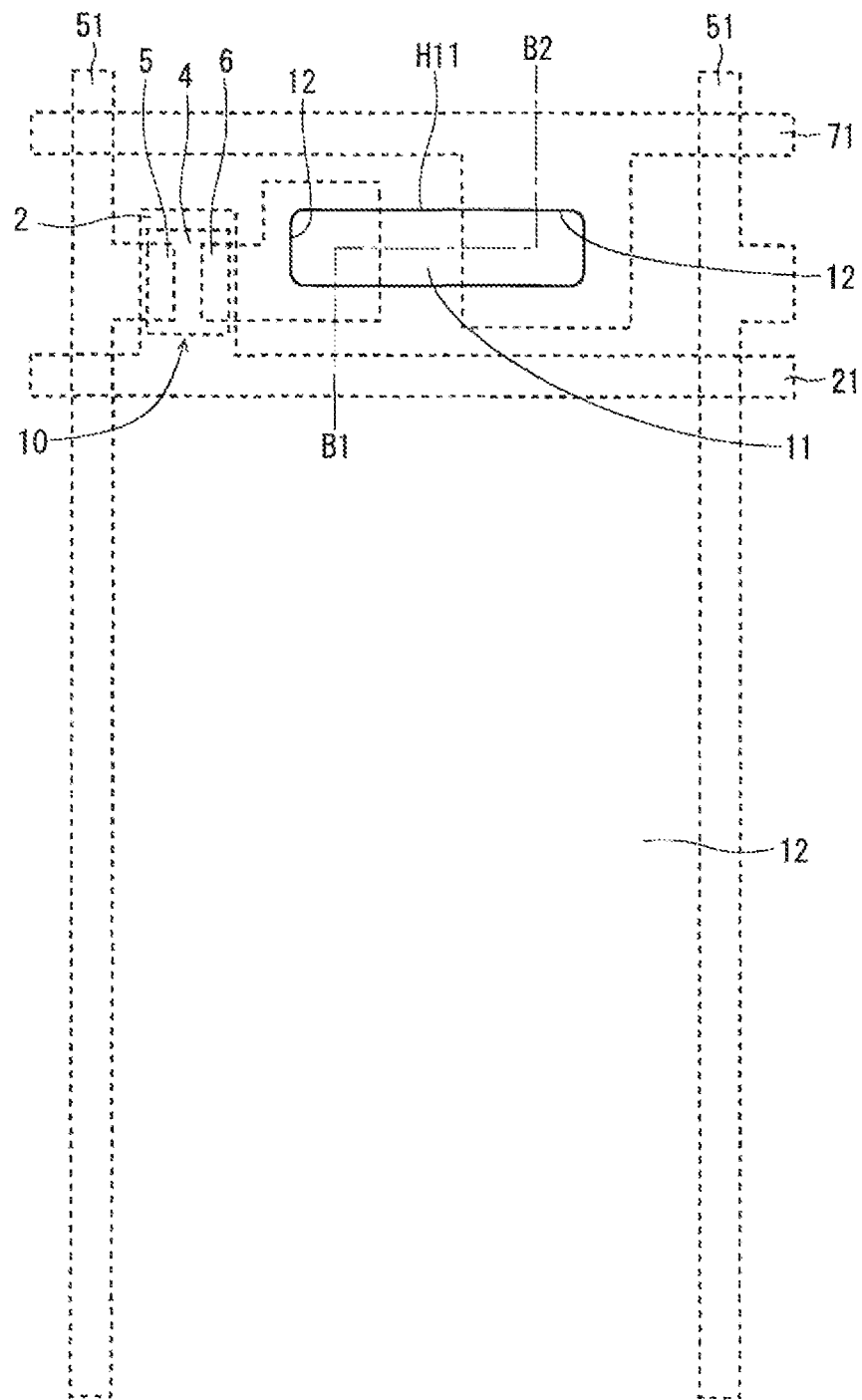
FIG. 31 is a plan view illustrating the step of manufacturing the array substrate according to the third preferred embodiment.

Then, a photosensitive organic resin film is applied so that the second interlayer insulating film 12 is formed, and the second interlayer insulating film 12 is exposed to be developed at a fourth photoengraving step. As a result, the aperture H11 is formed across the drain electrode 6 and the common wiring 71 as shown in FIG. 30. Further, FIG. 31 illustrates a top view of the pixel region in this state. The first interlayer insulating film 11 is exposed on the bottom of the aperture H11.

Figure 32:
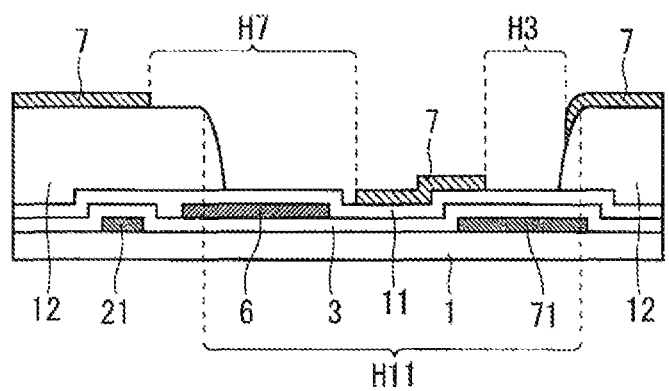
FIG. 32 is a cross-sectional view illustrating the step of manufacturing the array substrate according to the third preferred embodiment.

The first transparent conductive film (for example, IZO with thickness of 80 nm) is deposited by a sputtering method. A resist mask is formed at the fifth photoengraving step, the first transparent conductive film is patterned by etching using the resist mask as a mask, so that the common electrode 7 is formed (FIG. 32). At this time, on the common electrode 7, the aperture H7 is formed on a position corresponding to the drain electrode 6, and the aperture H3 is formed on a position corresponding to the common wiring 71.

Figure 33:
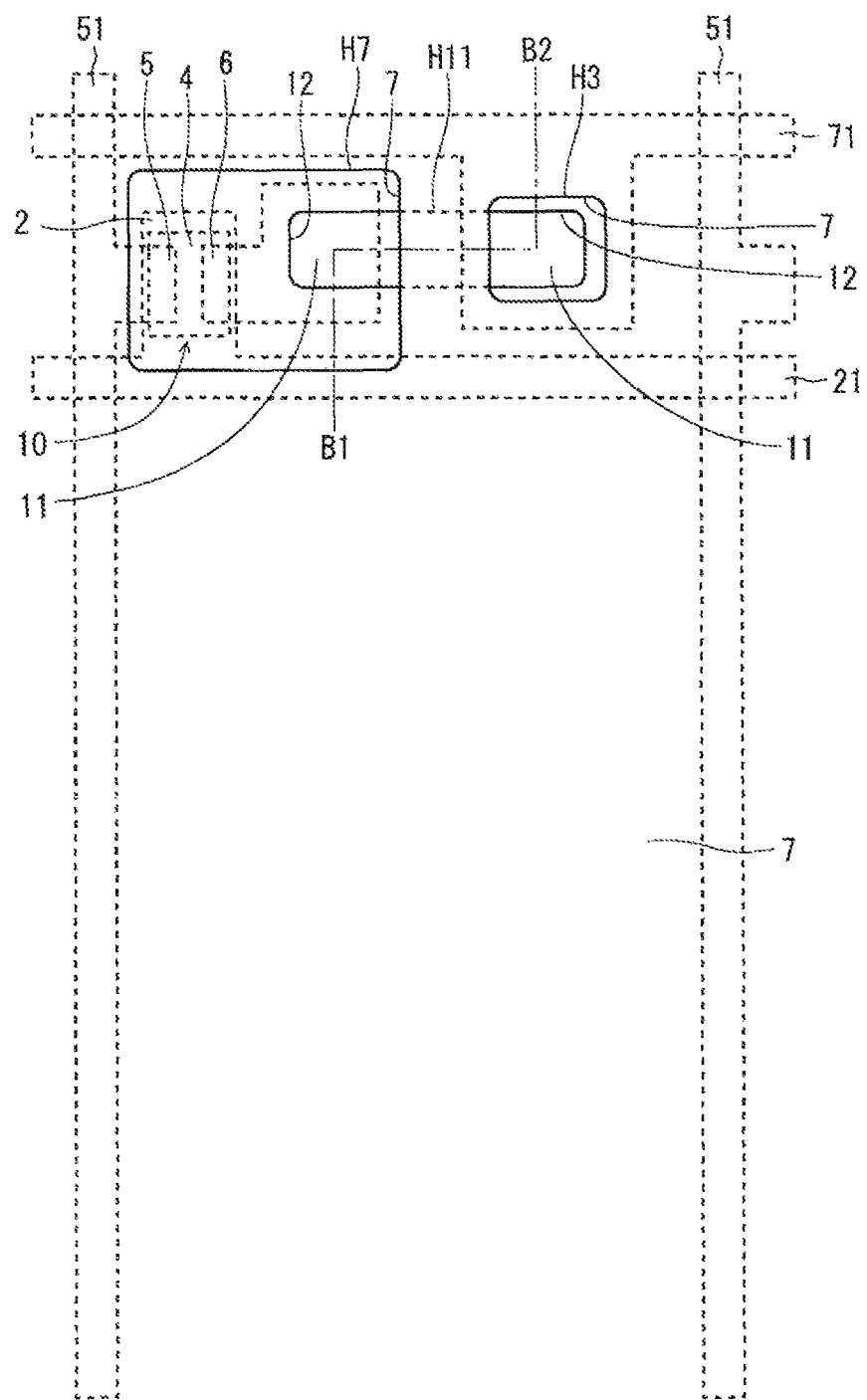
FIG. 33 is a plan view illustrating the step of manufacturing the array substrate according to the third preferred embodiment.

Thereafter, the resist mask 201 is removed by the stripping solution. FIG. 33 illustrates a top view of the pixel region in this state. The gate wirings 21 and the source wirings 51 are covered with the common electrode 7. The first interlayer insulating film 11 on the bottom of the aperture H11 is exposed inside the apertures H7 and H3.

Figure 34:
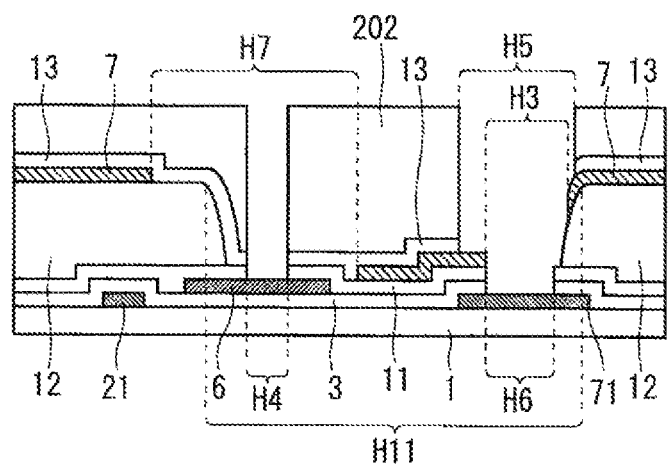
FIG. 34 is a cross-sectional view illustrating the step of manufacturing the array substrate according to the third preferred embodiment.

The third interlayer insulating film 13 (for example, silicon nitride with thickness of 200 nm) is then deposited by a CVD method. A resist mask 202 is formed at a sixth photoengraving step, the aperture H4 is formed on a position corresponding to the drain electrode 6 and the aperture H5 is formed on a position corresponding to the common wiring 71 in the aperture H11 of the second interlayer insulating film 12 by dry etching using the resist mask 202 as a mask. The aperture H4 is formed so as to penetrate the third interlayer insulating film 13 and the first interlayer insulating film 11 and to reach the drain electrode 6. Further, when the aperture H5 is formed on the third interlayer insulating film 13, the common electrode 7 and the second interlayer insulating film 12 are exposed near the edge portion of the aperture. When the etching is further continued, the first interlayer insulating film 11 and the gate insulating film 3 on the bottom of the aperture H11 are removed by using the common electrode 7 and the second interlayer insulating film 12 as masks, so that the aperture H6, which reaches the common wiring 71, is formed (FIG. 34). Therefore, the shape of the aperture H6 is similar to that of a region where the bottom portion of the aperture H11 and the aperture H3 overlap with each other. In other words, the aperture H6 has a portion whose outline is similar to the outline of the bottom portion of the aperture H11, and a portion whose outline is similar to the outline of the aperture H3.

Figure 35:
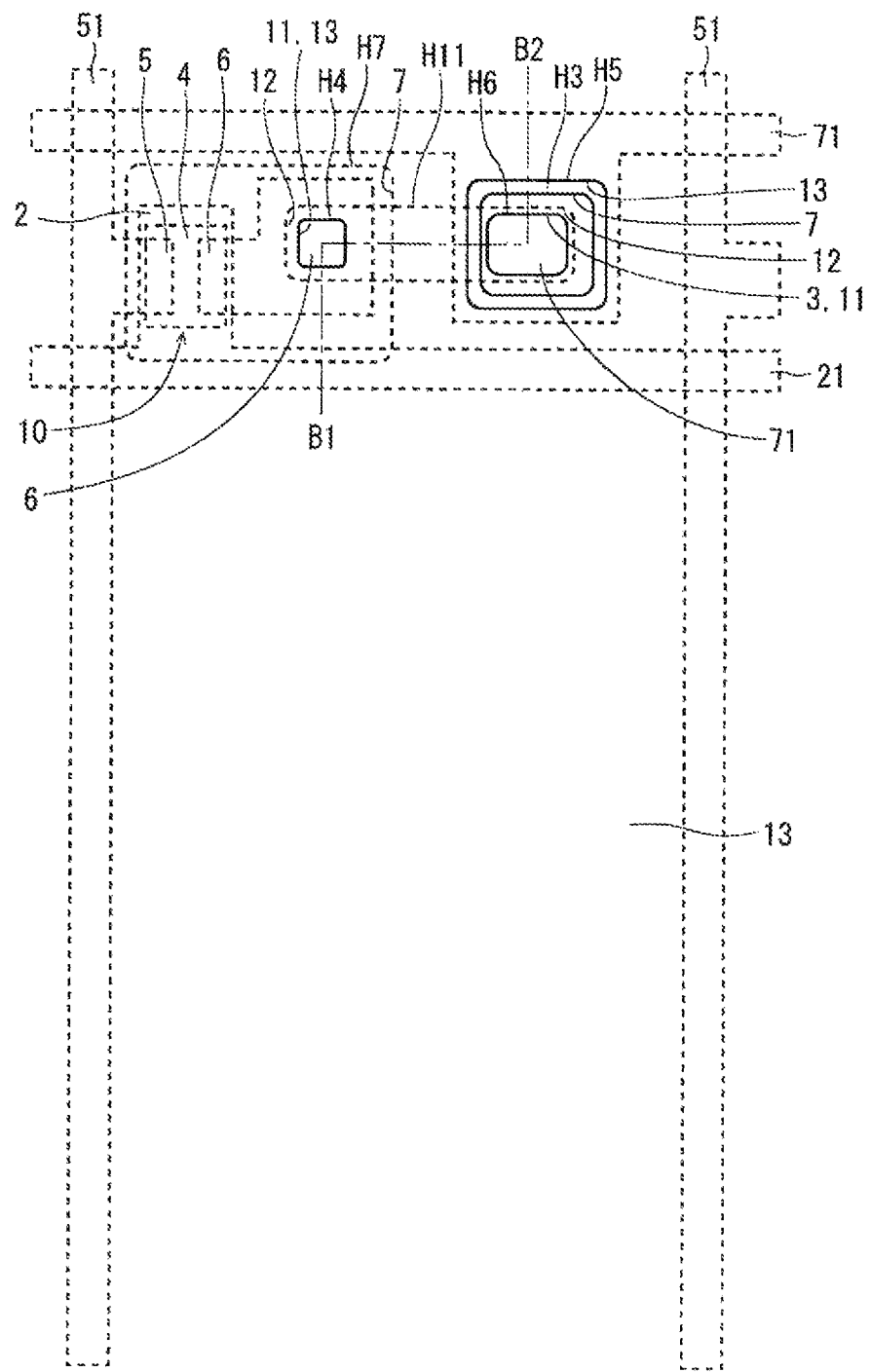
FIG. 35 is a plan view illustrating the step of manufacturing the array substrate according to the third preferred embodiment.

Thereafter, the resist mask 202 is removed by the stripping solution. FIG. 35 illustrates a top view of the pixel region in this state. The drain electrode 6 of the TFT 10 is exposed on the bottom of the aperture H4. The common electrode 7 is exposed on an edge portion of the aperture H5, and the common wiring 71 is exposed on a bottom portion.

The second transparent conductive film is deposited in the same manner as the step described with reference to FIG. 16 in the first preferred embodiment. A resist mask is formed at a seventh photoengraving step, and the second transparent conductive film is patterned by etching using the resist mask as a mask, so that the pixel electrode 8 and the contact electrode 72 are formed. The pixel electrode 8 is connected to the drain electrode 6 of the TFT 10 via the aperture H4 which penetrates the third interlayer insulating film 13 and the first interlayer insulating film 11. The contact electrode 72 is formed on at least a part inside the aperture H5, and electrically connects the common electrode 7 and the common wiring 71 exposed in the aperture H5.

Thereafter, when the resist mask is removed by a stripping solution, a configuration shown in FIG. 28 and FIG. 29 is obtained.

In the first preferred embodiment, the aperture H4 is formed on the bottom portion of the aperture H1 formed on the second interlayer insulating film 12 with large thickness, but when the aperture H1 is narrow, the insufficient exposure occurs at the time of forming the resist mask and thus the aperture H4 might not be satisfactorily formed. In the third preferred embodiment, since the aperture H11 with large diameter is formed by connecting the apertures H1 and H2 of the second interlayer insulating film 12 to each other, the insufficient exposure at the time of forming the resist mask can be prevented, so that the aperture H4 can be stably formed.

Further, a channel region of the TFT 10 (a portion between the source electrode 5 and the drain electrode 6 on the semiconductor film 4) is covered with the common electrode 7, but the common electrode 7 above the channel region may be removed.

Modified Example

Figure 36:
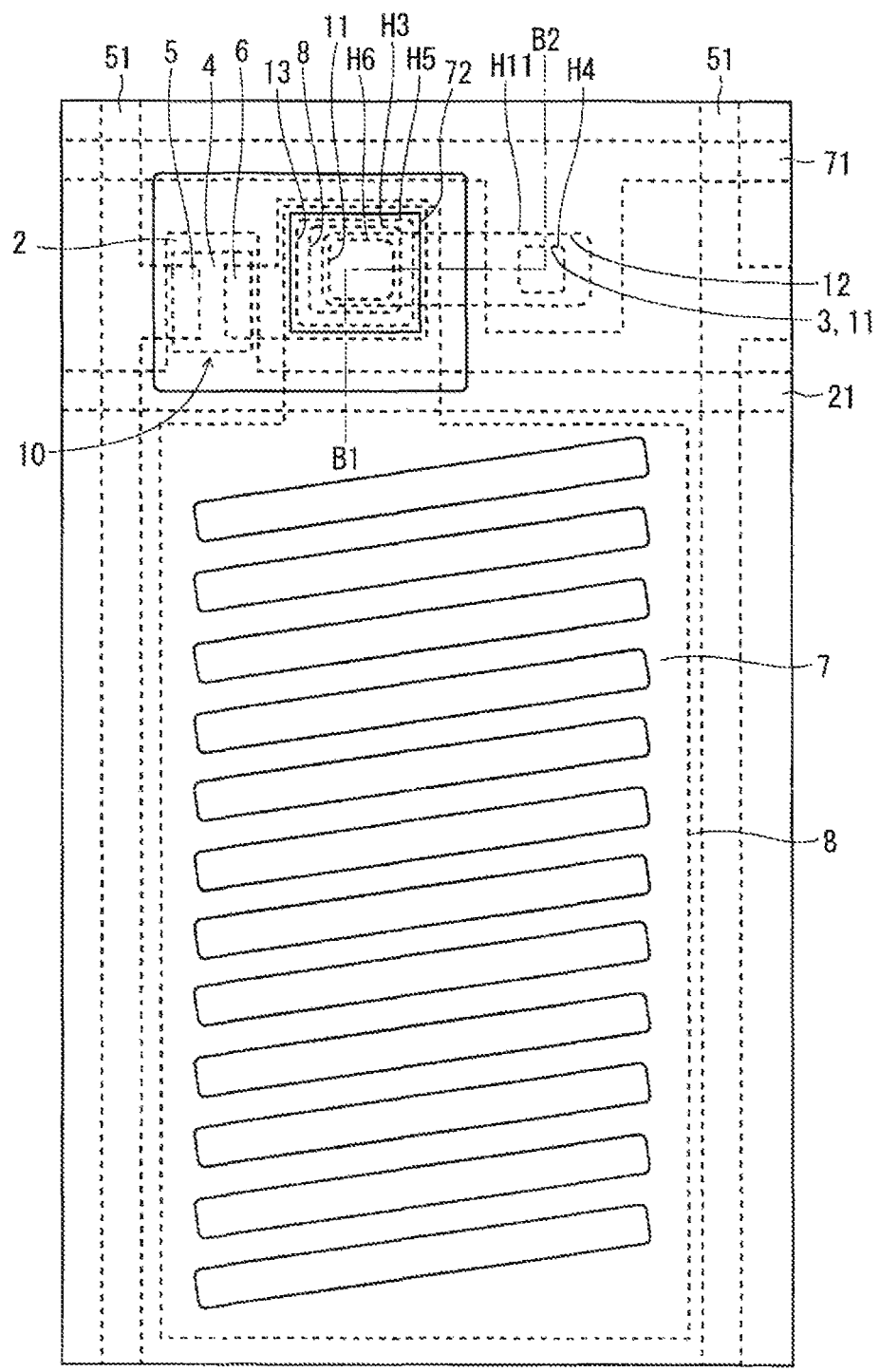
FIG. 36 is a plan view of a pixel of an array substrate according to a modified example of the third preferred embodiment.

Also in the third preferred embodiment, the common electrode 7 is disposed under the pixel electrode 8 as shown in FIG. 28 and FIG. 29, however, the common electrode 7 may be disposed above the pixel electrode 8. In other words, as shown in FIG. 36 and FIG. 37, the plate-shaped pixel electrode 8 made of the first transparent conductive film is disposed on the second interlayer insulating film 12, and the common electrode 7 having a lattice or comb-tooth shape and made of the second transparent conductive film may be disposed above the plate-shaped pixel electrode 8. In this case, the pixel electrode 8 (the first transparent conductive film) is exposed on the inner wall of the aperture H11 on the side of the drain electrode 6, and the contact electrode 72 made of the second transparent conductive film is formed on the drain electrode 6, so that the drain electrode 6 and the pixel electrode 8 are electrically connected to each other.

This configuration is realized by interchanging the formation position of the aperture H4 and the formation position of the apertures H3, H5, and H6 and the contact electrode 72 in FIG. 28 and FIG. 29 with each other. In other words, the aperture H3 of the first transparent conductive film and the aperture H5 of the third interlayer insulating film 13 including the aperture H3 are formed on a position corresponding to the drain electrode 6. The aperture H6 of the first interlayer insulating film 11 formed in the self-alignment manner at the time of forming the aperture H5 is formed so as to reach the drain electrode 6. Further, the aperture H4 of the third interlayer insulating film 13 is formed on a position corresponding to the common wiring 71 so as to reach the common wiring 71.

Further, the contact electrode 72 made of the second transparent conductive film is formed in the aperture H5, so that the drain electrode 6 and the pixel electrode 8 are electrically connected. Further, a part of the common electrode 7 is formed inside the aperture H4 so that the common electrode 7 is electrically connected to the common wiring 71.

Fourth Preferred Embodiment

Figure 38:
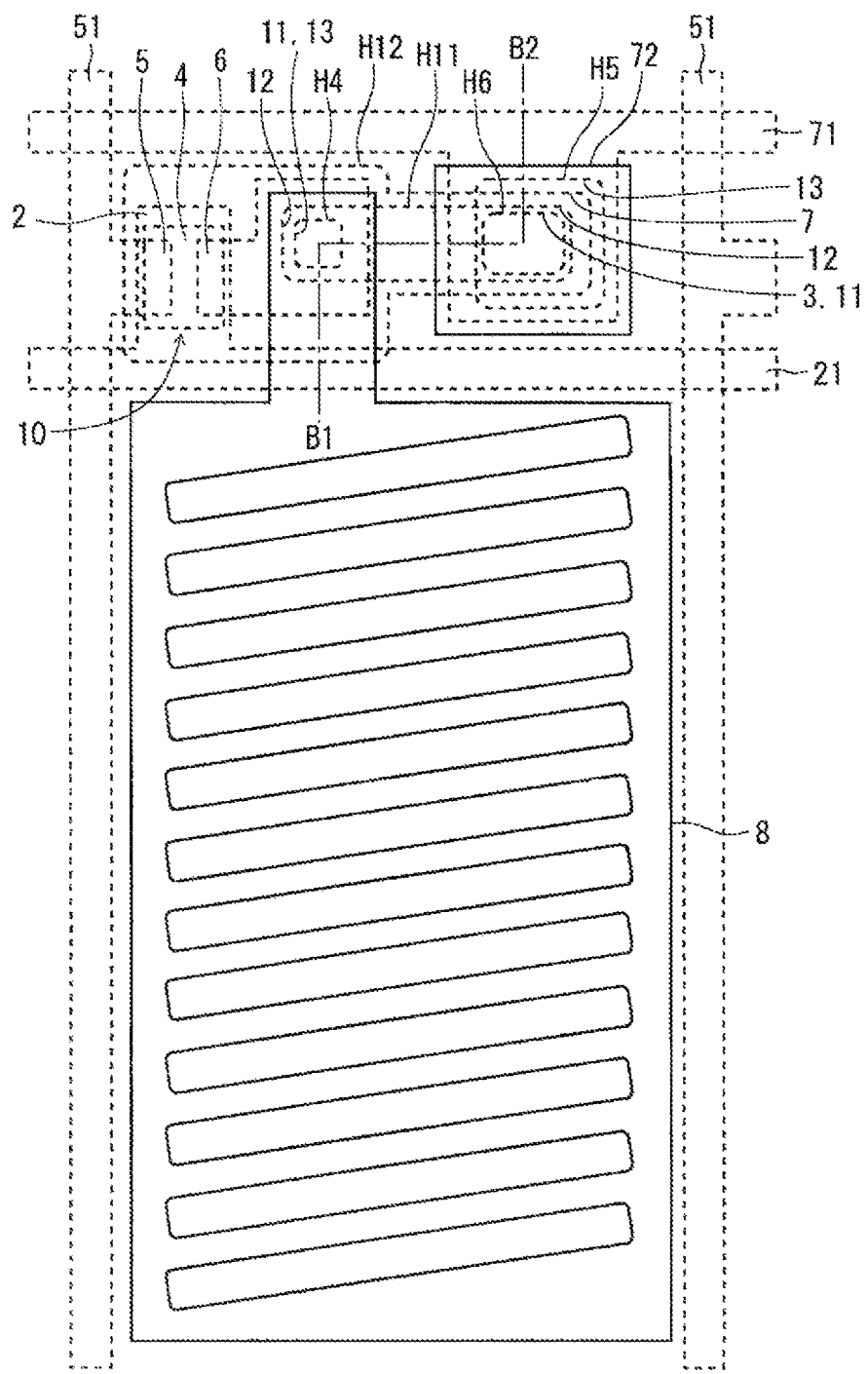
FIG. 38 is a plan view of a pixel of an array substrate according to a fourth preferred embodiment.
Figure 39:
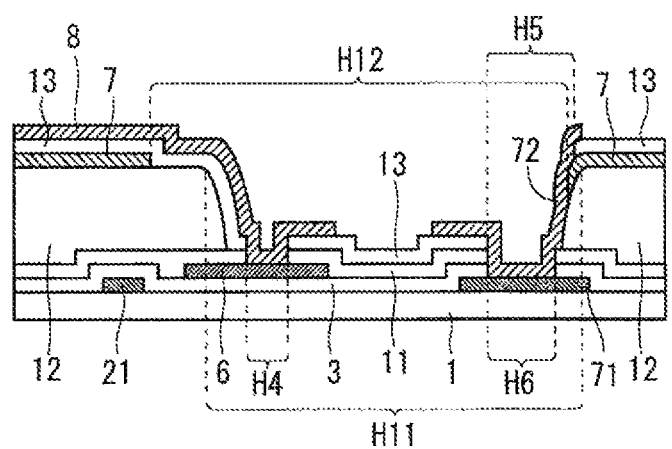
FIG. 39 is a cross-sectional view of a main section of the array substrate according to the fourth preferred embodiment.

FIG. 38 and FIG. 39 are views illustrating a configuration of a substrate 110 according to the fourth preferred embodiment. FIG. 38 is a view illustrating a plan configuration of a pixel 111 on the array substrate 110. FIG. 39 is a view illustrating a cross-sectional configuration of a formation region (pixel region) of the pixel 111, and corresponds to a cross section taken along line B1-B2 shown in FIG. 38. Since a configuration of a formation region (terminal region) of a terminal provided to an end portion of a gate wiring 21 or a source wiring 51, and a configuration of a formation region (wiring converting region) of a wiring converter 52 for connecting a lead-out wiring 55 of the source wiring 51 to lead-out wirings 25 on the same layer as the gate wiring 21 are similar to those in the first preferred embodiment, illustration and description thereof are omitted.

In the third preferred embodiment, an aperture H7 of a common electrode 7, which is provided to a position corresponding to a drain electrode 6, is separated from an aperture H3 of the common electrode 7 provided to a position corresponding to a common wiring 71. However, in the fourth preferred embodiment, the apertures H3 and H7 are connected so as to be formed integrally. In other words, as shown in FIG. 38 and FIG. 39, an aperture H12 is formed on the common electrode 7 across the drain electrode 6 and the common wiring 71. An end portion of the aperture H12 on the side of the drain electrode 6 is positioned outside the aperture H11, and an end portion of the aperture H12 on the side of the common wiring 71 is positioned on an inclined plane of the inner wall of the aperture H11. Therefore, a pattern of a first transparent conductive film does not remain on a bottom surface of the aperture H11.

The aperture H4 disposed on a position corresponding to the drain electrode 6 and the aperture H5 disposed on a position corresponding to the common wiring 71 are formed on a third interlayer insulating film 13 covering the common electrode 7. The aperture H4 penetrates also a first interlayer insulating film 11 below the third interlayer insulating film 13, and reaches the drain electrode 6. A part of the end portion of the aperture H5 is positioned outside the aperture H12, and a part of the common electrode 7 (a portion around the aperture H12) exposed on the inner wall of the aperture H11 is exposed on that part. Further, an aperture H6 is formed in the aperture H5 so as to penetrate the first interlayer insulating film 11 and a gate insulating film 3 and reach the common wiring 71.

A pixel electrode 8 and a contact electrode 72, which are made of a second transparent conductive film, are formed on the third interlayer insulating film 13. A part of the pixel electrode 8 is connected to the drain electrode 6 in the aperture H12 via the aperture H4. Further, the contact electrode 72 is connected to the common wiring 71 via the aperture H6 in the aperture H5, and also to the common electrode 7 exposed in the aperture H5. In other words, the contact electrode 72 electrically connects the common wiring 71 and the common electrode 7.

Thus, when the pattern of the common electrode 7 is removed from the bottom portion of an aperture H11 of a second interlayer insulating film 12, a distance between the aperture H4 and the aperture H6 can be shortened, and the aperture H11 can be reduced. As a result, an aperture ratio of the pixel 111 can be heightened.

A method for manufacturing a liquid crystal display device 100 according to the fourth preferred embodiment is described. A TFT 10, the first interlayer insulating film 11, and the second interlayer insulating film 12 are formed on the substrate 1 in the same manner as that in the third preferred embodiment, and the aperture H11 is formed on the second interlayer insulating film 12 (FIG. 30, FIG. 31). The photoengraving step has been executed four times at this point.

Figure 40:
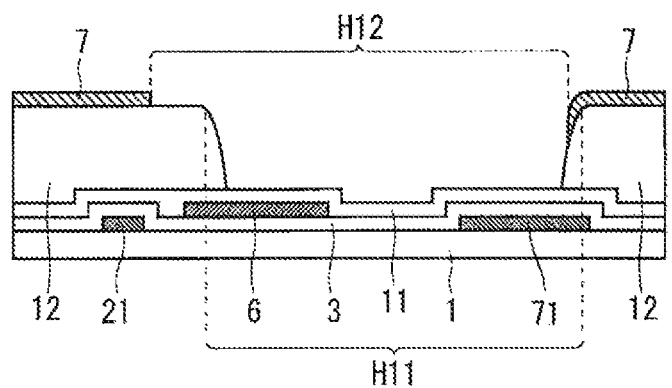
FIG. 40 is a cross-sectional view illustrating a step of manufacturing the array substrate according to the fourth preferred embodiment.

The first transparent conductive film (for example, IZO with thickness of 80 nm) is then deposited by a sputtering method. A resist mask is formed at a fifth photoengraving step, the first transparent conductive film is patterned by etching using the resist mask as a mask, so that the common electrode 7 is formed (FIG. 40). At this time, the aperture H12 is formed on the common electrode 7 across the drain electrode 6 and the common wiring 71.

Figure 41:
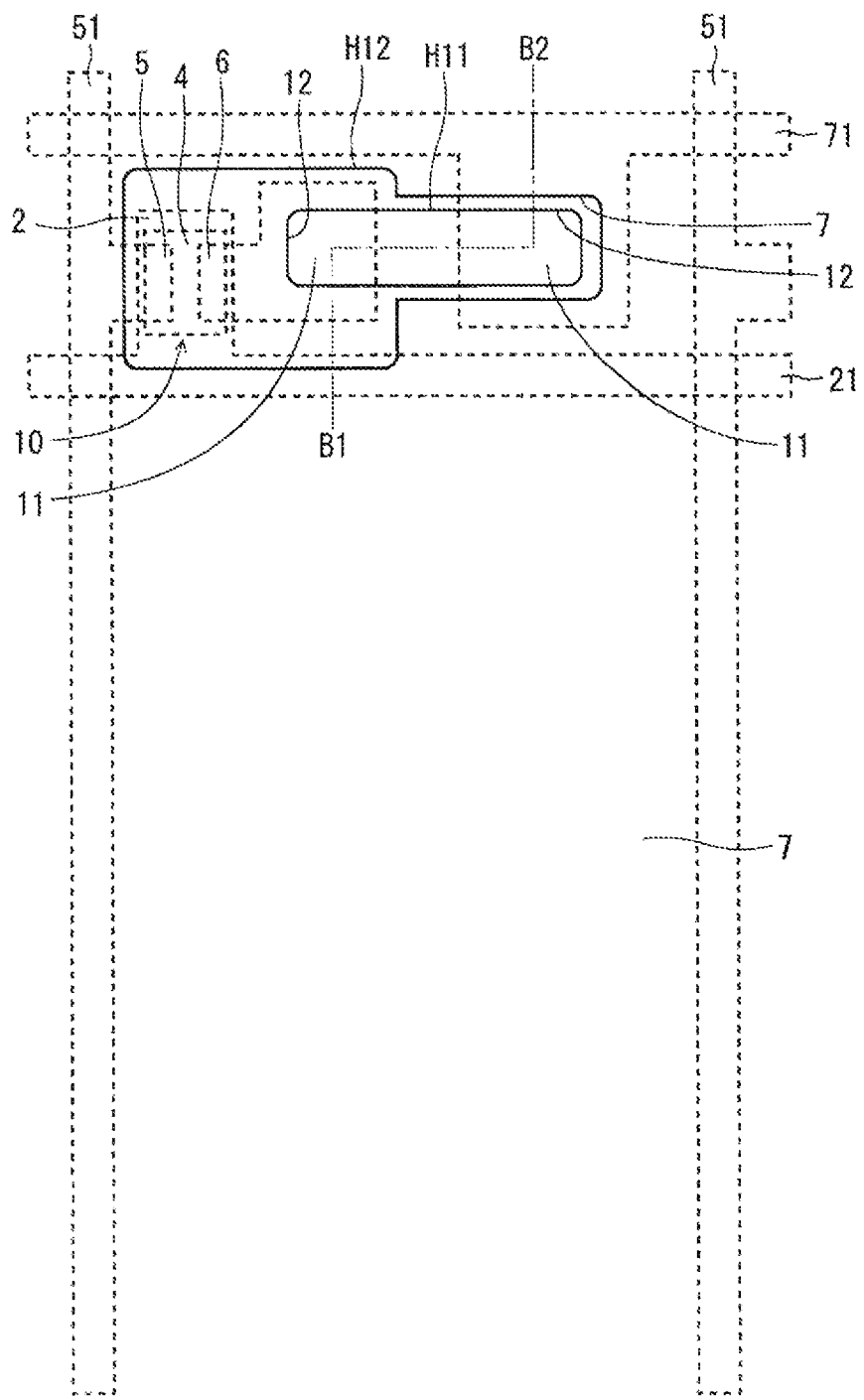
FIG. 41 is a plan view illustrating the step of manufacturing the array substrate according to the fourth preferred embodiment.

Thereafter, the resist mask 201 is removed by the stripping solution. FIG. 41 illustrates a top view of a pixel region in this state. The gate wirings 21 and the source wirings 51 are covered with the common electrode 7. The first interlayer insulating film 11 on the bottom of the aperture H11 is exposed inside the aperture H12. Further, the pattern of the common electrode 7 does not remain on the bottom of the aperture H11.

Figure 42:
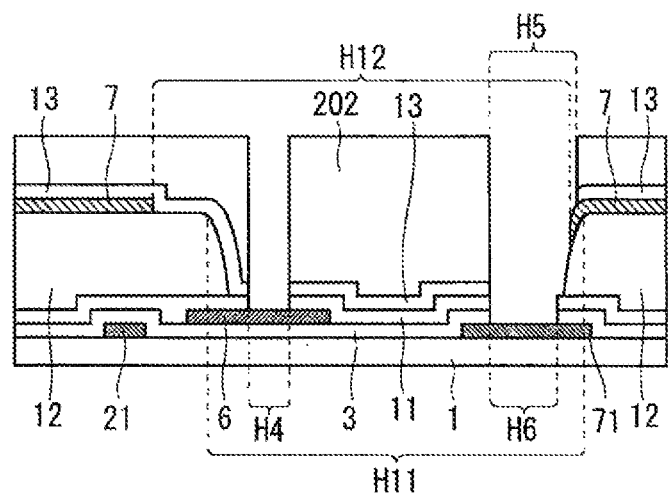
FIG. 42 is a cross-sectional view illustrating the step of manufacturing the array substrate according to the fourth preferred embodiment.

The third interlayer insulating film 13 (for example, silicon nitride with thickness of 200 nm) is then deposited by a CVD method. A resist mask 202 is formed at a sixth photoengraving step, the aperture H4 is formed on a position corresponding to the drain electrode 6 and the aperture H5 is formed on a position corresponding to the common wiring 71 in the aperture H11 of the second interlayer insulating film 12 by dry etching using the resist mask 202 as a mask. The aperture H4 is formed so as to penetrate the third interlayer insulating film 13 and the first interlayer insulating film 11 and to reach the drain electrode 6. Further, when the aperture H5 is formed on the third interlayer insulating film 13, the common electrode 7 and the second interlayer insulating film 12 on the inner wall of the aperture H12 are exposed. However, when the etching is further continued, the first interlayer insulating film 11 and the gate insulating film 3 on the bottom of an aperture H2 are removed by using the common electrode 7 and the second interlayer insulating film 12 as masks, and the aperture H6 that reaches the common wiring 71 is formed (FIG. 42). Therefore, the shape of the aperture H6 is similar to that of a region where a bottom portion of the aperture H11 and the aperture H5 overlap with each other. In other words, the aperture H6 has a portion whose outline is similar to the outline of the bottom portion of the aperture H11, and a portion whose outline is similar to the outline of the aperture H6.

Figure 43:
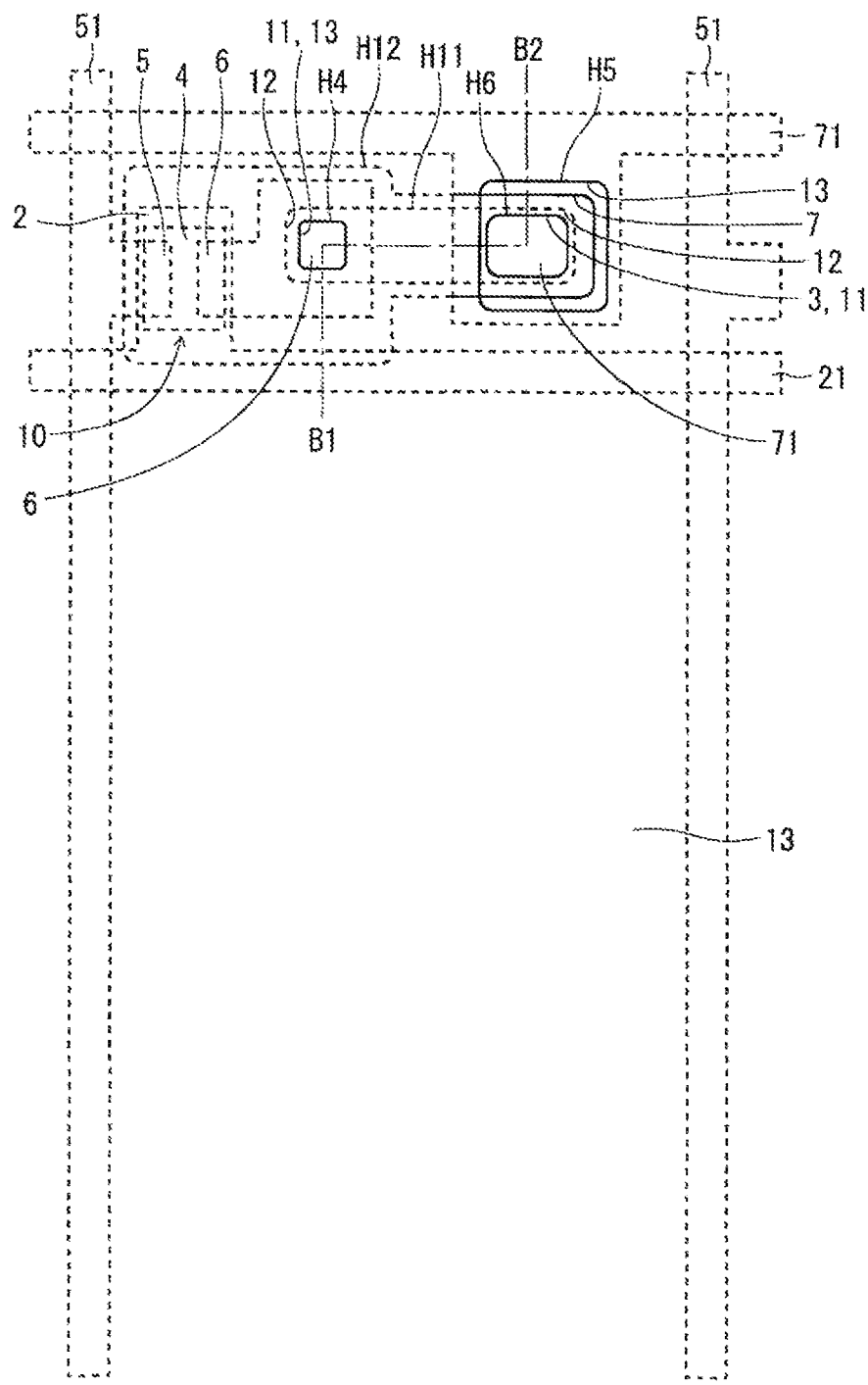
FIG. 43 is a plan view illustrating the step of manufacturing the array substrate according to the fourth preferred embodiment.

Thereafter, the resist mask 202 is removed by the stripping solution. FIG. 43 illustrates a top view of a pixel region in this state. The drain electrode 6 of the TFT 10 is exposed on the bottom of the aperture H4. The common electrode 7 is exposed on an edge portion of the aperture H5, and the common wiring 71 is exposed on a bottom portion.

The second transparent conductive film is deposited in the same manner as the step described with reference to FIG. 16 in the first preferred embodiment. A resist mask is formed at a seventh photoengraving step, and the second transparent conductive film is patterned by etching using the resist mask as a mask, so that the pixel electrode 8 and the contact electrode 72 are formed. The pixel electrode 8 is connected to the drain electrode 6 of the TFT 10 via the aperture H4 which penetrates the third interlayer insulating film 13 and the first interlayer insulating film 11. The contact electrode 72 is formed on at least a part inside the aperture H5, and electrically connects the common electrode 7 and the common wiring 71 exposed in the aperture H5.

Thereafter, when the resist mask is removed by a stripping solution, a configuration shown in FIG. 38 and FIG. 39 is obtained.

In the fourth preferred embodiment, the pattern of the common electrode 7 does not allow to remain on the bottom portion of the aperture H11 of the second interlayer insulating film 12, and the aperture H12 including the aperture H11 is formed. As a result, occurrence of the residue of the first transparent conductive film due to insufficient exposure is prevented, and a process can be obtained in which a defective pixel caused by short-circuit between the common electrode and the pixel is less likely to occur in a contact region even when a fluctuation in a manufacturing process occurs.

Further, a channel region of the TFT 10 (a portion between the source electrode 5 and the drain electrode 6 on the semiconductor film 4) is covered with the common electrode 7, but the common electrode 7 above the channel region may be removed.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor array substrate comprising:
a thin film transistor formed on a substrate;
a common wiring formed on said substrate;
a first interlayer insulating film formed on said thin film transistor and said common wiring;
a second interlayer insulating film formed on said first interlayer insulating film;
a common electrode formed on said second interlayer insulating film;
a third interlayer insulating film formed on said common electrode; and
a pixel electrode formed on said third interlayer insulating film,
wherein said pixel electrode is connected to a drain electrode of said thin film transistor via a first aperture formed on said second interlayer insulating film, a second aperture that includes a bottom portion of said first aperture and is formed on said common electrode, and a third aperture that is included in the bottom portion of said first aperture and is formed on said first interlayer insulating film and said third interlayer insulating film, said common electrode is connected indirectly to said common wiring via a fourth aperture formed on said second interlayer insulating film, and a fifth aperture that is included in a bottom portion of said fourth aperture and is formed on a first interlayer insulating film, at least a part of said common electrode is exposed from said third interlayer insulating film on an inclined plane of an inner wall of said fourth aperture so as to be formed on said inner wall of said fourth aperture, said common electrode and said common wiring are connected via a contact electrode that is connected between a portion of said common electrode formed on the inner wall of said fourth aperture and said common wiring exposed on said fifth aperture, and is made of a conductive film on the same layer as said pixel electrode.

2. The thin film transistor array substrate according to claim 1, wherein said fifth aperture has a similar shape to a shape of the bottom portion of said fourth aperture.

3. The thin film transistor array substrate according to claim 1, wherein said fifth aperture is formed so as to penetrate said first interlayer insulating film and a gate insulating film of said thin film transistor.

4. The thin film transistor array substrate according to claim 1, wherein said second interlayer insulating film is removed from a formation region of a terminal for connecting an external wiring.

5. The thin film transistor array substrate according to claim 1, wherein said second interlayer insulating film is removed from a formation region of a wiring converter for connecting wirings on different layers to each other.

6. A thin film transistor array substrate comprising:
a thin film transistor formed on a substrate;
a common wiring formed on said substrate;
a first interlayer insulating film formed on said thin film transistor;
a second interlayer insulating film formed on said first interlayer insulating film;
a pixel electrode formed on said second interlayer insulating film;
a third interlayer insulating film formed on said pixel electrode; and
a common electrode formed on said third interlayer insulating film,
wherein said pixel electrode is connected indirectly to a drain electrode of said thin film transistor via a first aperture formed on said second interlayer insulating film and a second aperture that is included in a bottom portion of said first aperture and is formed on a first interlayer insulating film,
at least a part of said pixel electrode is exposed from said third interlayer insulating film on an inclined plane of the inner wall of said first aperture so as to be formed on said inner wall of said first aperture,
said pixel electrode and said drain electrode are connected via a contact electrode that is connected between a portion of said pixel electrode formed on the inner wall of said first aperture and said drain electrode exposed on said second aperture, and is made of a conductive film on the same layer as said common electrode.

7. The thin film transistor array substrate according to claim 6, wherein said second aperture has a similar shape to a shape of the bottom portion of said first aperture.

8. The thin film transistor array substrate according to claim 6, wherein said second interlayer insulating film is removed from a formation region of a terminal for connecting an external wiring.

9. The thin film transistor array substrate according to claim 6, wherein said second interlayer insulating film is removed from a formation region of a wiring converter for connecting wirings on different layers to each other.

10. A thin film transistor array substrate comprising:
a thin film transistor formed on a substrate;
a common wiring formed on said substrate;
a first interlayer insulating film formed on said thin film transistor and said common wiring;
a second interlayer insulating film formed on said first interlayer insulating film;
a common electrode formed on said second interlayer insulating film;
a third interlayer insulating film formed on said common electrode;
a pixel electrode formed on said third interlayer insulating film; and
a first aperture formed on said second interlayer insulating film across a drain electrode of said thin film transistor and said common wiring,
wherein said pixel electrode is connected to a drain electrode of said thin film transistor via said first aperture, a second aperture that includes a part of a bottom portion of said first aperture and is formed on said common electrode, and a third aperture that is included in the bottom portion of said first aperture and is formed on said first interlayer insulating film and said third interlayer insulating film,
said common electrode is connected indirectly to said common wiring via said first aperture and a fourth aperture that is included in the bottom portion of said first aperture and is formed on a first interlayer insulating film,
at least a part of said common electrode is exposed from said third interlayer insulating film on an inclined plane of the inner wall of said first aperture, so as to be formed on said inner wall of said first aperture, on a side of said common wiring,
said common electrode and said common wiring are connected via a contact electrode that is connected between a portion of said common electrode formed on the inner wall of said first aperture and said common wiring exposed on said fourth aperture, and is made of a conductive film on the same layer as said pixel electrode.

11. The thin film transistor array substrate according to claim 10, wherein a part of an outline of said fourth aperture has a similar shape to a shape of a part of an outline of the bottom portion of said first aperture.

12. The thin film transistor array substrate according to claim 10, wherein said second aperture is formed across a drain electrode of said thin film transistor and said common wiring.

13. The thin film transistor array substrate according to claim 10, wherein said fourth aperture is formed so as to penetrate said first interlayer insulating film and a gate insulating film of said thin film transistor.

14. The thin film transistor array substrate according to claim 10, wherein
said second interlayer insulating film is removed from a formation region of a terminal for connecting an external wiring.

15. The thin film transistor array substrate according to claim 10, wherein
said second interlayer insulating film is removed from a formation region of a wiring converter for connecting wirings on different layers to each other.

16. A thin film transistor array substrate comprising:
a thin film transistor formed on a substrate;
a common wiring formed on said substrate;
a first interlayer insulating film formed on said thin film transistor and said common wiring;
a second interlayer insulating film formed on said first interlayer insulating film;
a pixel electrode formed on said second interlayer insulating film;
a third interlayer insulating film formed on said pixel electrode;
a common electrode formed on said third interlayer insulating film; and
a first aperture formed on said second interlayer insulating film across a drain electrode of said thin film transistor and said common wiring,
wherein said common electrode is connected to said common wiring via said first aperture and a second aperture that is included in a bottom portion of said first aperture and is formed on said first interlayer insulating film and said third interlayer insulating film,
said pixel electrode is connected indirectly to a drain electrode of said thin film transistor via said first aperture and a third aperture that is included in the bottom portion of said first aperture and is formed on a first interlayer insulating film,
a part of said pixel electrode is exposed from said third interlayer insulating film on an inclined plane of the inner wall of said first aperture, so as to be formed on said inner wall of said first aperture, on a side of said drain electrode,
said pixel electrode and said drain electrode are connected via a contact electrode that is connected between a portion of said pixel electrode formed on the inner wall of said first aperture and said drain electrode exposed on said third aperture, and is made of a conductive film on the same layer as said common electrode.

17. The thin film transistor array substrate according to claim 16, wherein
a part of an outline of said third aperture has a similar shape to a shape of a part of an outline of the bottom portion of said first aperture.

18. The thin film transistor array substrate according to claim 16, wherein
said second aperture is formed so as to penetrate said first interlayer insulating film and a gate insulating film of said thin film transistor.

19. The thin film transistor array substrate according to claim 16, wherein
said second interlayer insulating film is removed from a formation region of a terminal for connecting an external wiring.

20. The thin film transistor array substrate according to claim 16, wherein
said second interlayer insulating film is removed from a formation region of a wiring converter for connecting wirings on different layers to each other.

21. The thin film transistor array substrate according to claim 1, wherein the at least a part of said common electrode is exposed from said third interlayer insulating film only on the inner wall of said fourth aperture.

22. The thin film transistor array substrate according to claim 1, wherein said contact electrode contacts said common electrode only on the inner wall of said fourth aperture and does not contact a top surface of said common electrode facing said third interlayer insulating film.

23. The thin film transistor array substrate according to claim 6, wherein the at least a part of said pixel electrode is exposed from said third interlayer insulating film only on the inner wall of said first aperture.

24. The thin film transistor array substrate according to claim 6, wherein said contact electrode contacts said pixel electrode only on the inner wall of said first aperture and does not contact a top surface of said pixel electrode facing said third interlayer insulating film.

25. The thin film transistor array substrate according to claim 10, wherein the at least a part of said common electrode is exposed from said third interlayer insulating film only on the inner wall of said first aperture on a side of said common wiring.

26. The thin film transistor array substrate according to claim 10, wherein said contact electrode contacts said common electrode only on the inner wall of said first aperture and does not contact a top surface of said common electrode facing said third interlayer insulating film.

27. The thin film transistor array substrate according to claim 16, wherein the part of said pixel electrode is exposed from said third interlayer insulating film only on the inner wall of said first aperture on a side of said drain electrode.

28. The thin film transistor array substrate according to claim 16, wherein said contact electrode contacts said pixel electrode only on the inner wall of said first aperture and does not contact a top surface of said pixel electrode facing said third interlayer insulating film.

* * * * *